(12) United States Patent
Nagasaka

(10) Patent No.: US 10,209,622 B2
(45) Date of Patent: *Feb. 19, 2019

(54) EXPOSURE METHOD AND DEVICE MANUFACTURING METHOD HAVING LOWER SCANNING SPEED TO EXPOSE PERIPHERAL SHOT AREA

(75) Inventor: Hiroyuki Nagasaka, Kumagaya (JP)

(73) Assignee: NIKON CORPORATION, Tokyo (JP)

( * ) Notice: Subject to any disclaimer, the term of this patent is extended or adjusted under 35 U.S.C. 154(b) by 851 days.

This patent is subject to a terminal disclaimer.

(21) Appl. No.: 13/067,046

(22) Filed: May 4, 2011

(65) Prior Publication Data
US 2011/0211186 A1    Sep. 1, 2011

Related U.S. Application Data

(60) Division of application No. 11/355,965, filed on Feb. 17, 2006, now Pat. No. 8,064,037, which is a
(Continued)

(30) Foreign Application Priority Data

Aug. 21, 2003  (JP) .................................. 2003-297507
Feb. 16, 2004  (JP) .................................. 2004-038411

(51) Int. Cl.
G03F 7/20    (2006.01)

(52) U.S. Cl.
CPC .......... *G03F 7/70341* (2013.01); *G03F 7/709* (2013.01)

(58) Field of Classification Search
CPC .............................. G03F 7/70341; G03F 7/709
(Continued)

(56) References Cited

U.S. PATENT DOCUMENTS 4,346,164 A    8/1982    Tabarelli et al.
4,480,910 A    11/1984   Takanashi et al.
(Continued)

FOREIGN PATENT DOCUMENTS

DE    221 563 A1    4/1985
DE    224 448 A1    7/1985
(Continued)

OTHER PUBLICATIONS

Jun. 7, 2011 Office Action in Japanese Application No. 2009-165718, with translation.
(Continued)

*Primary Examiner* — Steven H Whitesell Gordon
(74) *Attorney, Agent, or Firm* — Oliff PLC

(57) ABSTRACT

An exposure method sequentially exposes a plurality of shot areas of a substrate. The method includes: (i) holding the substrate on a substrate holder such that a gap is formed along an edge of the substrate; (ii) exposing one of the shot areas, located near a center of the substrate, through a liquid of a liquid immersion area which covers only a portion of a surface of the substrate, while moving the substrate at a first scanning speed; and (iii) exposing an other one of the shot areas through the liquid of the liquid immersion area, while moving the substrate at a second scanning speed lower than the first scanning speed. The other one of the shot areas is located near the edge of the substrate and the gap is included in the liquid immersion area during the exposure of the other one of the shot areas.

70 Claims, 18 Drawing Sheets

Related U.S. Application Data continuation of application No. PCT/JP2004/012319, filed on Aug. 20, 2004.

(58) Field of Classification Search
USPC .................................................. 355/30, 53
See application file for complete search history.

(56) References Cited

U.S. PATENT DOCUMENTS

| | | | |
|---|---|---|---|
| 5,424,552 A | 6/1995 | Tsuji et al. | |
| 5,528,118 A | 6/1996 | Lee | |
| 5,610,683 A | 3/1997 | Takahashi | |
| 5,623,853 A | 4/1997 | Novak et al. | |
| 5,715,039 A | 2/1998 | Fukada et al. | |
| 5,825,043 A | 10/1998 | Suwa | |
| 5,874,820 A | 2/1999 | Lee | |
| 5,969,441 A | 10/1999 | Loopstra et al. | |
| 6,333,776 B1 | 12/2001 | Taniguchi | |
| 6,730,925 B1 | 5/2004 | Ozawa | |
| 6,801,301 B2 * | 10/2004 | Miyajima et al. | 355/72 |
| 7,199,858 B2 | 4/2007 | Lof et al. | |
| 7,388,649 B2 | 6/2008 | Kobayashi et al. | |
| 8,508,718 B2 | 8/2013 | Hazelton et al. | |
| 2003/0147059 A1 | 8/2003 | Tokuda et al. | |
| 2004/0136494 A1 | 7/2004 | Lof et al. | |
| 2004/0160582 A1 | 8/2004 | Lof et al. | |
| 2004/0165159 A1 | 8/2004 | Lof et al. | |
| 2004/0207824 A1 | 10/2004 | Lof et al. | |
| 2004/0211920 A1 | 10/2004 | Mario Derksen et al. | |
| 2004/0263809 A1 | 12/2004 | Nakano | |
| 2005/0046934 A1 | 3/2005 | Ho et al. | |
| 2005/0219488 A1 | 10/2005 | Nei et al. | |
| 2005/0219489 A1 | 10/2005 | Nei et al. | |
| 2005/0225735 A1 | 10/2005 | Magome et al. | |
| 2005/0259232 A1 | 11/2005 | Streefkerk et al. | |
| 2005/0259234 A1 | 11/2005 | Hirukawa et al. | |
| 2005/0264778 A1 | 12/2005 | Lof et al. | |
| 2006/0139614 A1 | 6/2006 | Owa et al. | |

FOREIGN PATENT DOCUMENTS

| | | |
|---|---|---|
| EP | 0 605 103 A1 | 7/1994 |
| EP | 1 571 694 A1 | 9/2005 |
| EP | 1 571 695 A1 | 9/2005 |
| EP | 1 571 697 A1 | 9/2005 |
| EP | 1 641 028 A1 | 3/2006 |
| EP | 1 653 501 A1 | 5/2006 |
| EP | 1 944 654 A2 | 7/2008 |
| JP | A-58-202448 | 11/1983 |
| JP | A-59-019912 | 2/1984 |
| JP | A-62-065326 | 3/1987 |
| JP | A-63-157419 | 6/1988 |
| JP | A-04-305915 | 10/1992 |
| JP | A-04-305917 | 10/1992 |
| JP | A-05-062877 | 3/1993 |
| JP | H06-084757 A | 3/1994 |
| JP | A-06-124873 | 5/1994 |
| JP | A-07-220990 | 8/1995 |
| JP | A-08-166475 | 6/1996 |
| JP | A-08-316125 | 11/1996 |
| JP | A-08-330224 | 12/1996 |
| JP | A-10-163099 | 6/1998 |
| JP | A-10-214783 | 8/1998 |
| JP | A-10-303114 | 11/1998 |
| JP | A-10-340846 | 12/1998 |
| JP | A-11-121328 | 4/1999 |
| JP | A-11-135400 | 5/1999 |
| JP | A-11-176727 | 7/1999 |
| JP | A-2000-058436 | 2/2000 |
| JP | A-2000-505958 | 5/2000 |
| JP | A-2004-207710 | 7/2004 |
| JP | A-2004-289127 | 10/2004 |
| JP | A-2005-19864 | 1/2005 |
| JP | A-2005-101487 | 4/2005 |
| JP | A-2005-101488 | 4/2005 |
| JP | A-2005-277363 | 10/2005 |
| WO | WO 98/28665 | 7/1995 |
| WO | WO99/49504 | 9/1999 |
| WO | WO 2004/019128 A2 | 3/2004 |
| WO | WO 2004/053952 A1 | 6/2004 |
| WO | WO 2004/053953 A1 | 6/2004 |
| WO | WO 2004/053955 A1 | 6/2004 |
| WO | WO 2004/055803 A1 | 7/2004 |
| WO | WO 2004/090634 A2 | 10/2004 |
| WO | WO 2004/112108 A1 | 12/2004 |

OTHER PUBLICATIONS

Dec. 27, 2007 Supplemental European Search Report in European Application No. 04772275.6.
Apr. 25, 2008 Communication Pursuant to Article 94(3) in European Application No. 04772275.6.
May 26, 2009 Communication Pursuant to Article 94(3) in European Application No. 04772275.6.
Jan. 4, 2008 Office Action in Chinese Application No. 200480023577.9, with translation.
Nov. 14, 2008 Notice of Allowance in Chinese Application No. 200480023577.9, with translation.
Dec. 14, 2004 International Search Report in Application No. PCT/JP2004/012319, with translation.
Dec. 14, 2004 Written Opinion in Application No. PCT/JP2004/012319, with translation.
Nov. 25, 2008 Office Action in Japanese Application No. 2005-513370, with translation.
May 19, 2009 Office Action in Japanese Application No. 2005-513370, with translation.
May 6, 2010 Notice of Allowance in Japanese Application No. 2005-513370, with translation.
1 Mar. 28, 2011 Office Action in Korean Application No. 2006-7003551, with translation.
Mar. 15, 2011 Office Action in Japanese Application No. 2009-013514, with translation.
May 14, 2008 Office Action in U.S. Appl. No. 11/355,965.
Nov. 19, 2008 Office Action in U.S. Appl. No. 11/355,965.
Jan. 8, 2009 Office Action in U.S. Appl. No. 11/355,965.
Sep. 24, 2009 Office Action in U.S. Appl. No. 11/355,965.
May 25, 2010 Notice of Allowance in U.S. Appl. No. 11/355,965.
Oct. 19, 2010 Notice of Allowance in U.S. Appl. No. 11/355,965.
Feb. 18, 2011 Notice of Albwance in U.S. Appl. No. 11/355,965.
Jun. 14, 2011 Notice of Allowance in Japanese Application No. 2009-013514 (with English translation).
Nov. 30, 2012 Office Action issued in Korean Application No. 2011-7022804 (with English translation).
Dec. 28, 2012 Office Action issued in Korean Application No. 2011-7026313 (with English translation).
Nov. 5, 2013 Office Action issued in Japanese Patent Application No. 2012-077682 (with translation).
Jan. 27, 2014 Office Action issued in U.S. Appl. No. 13/713,416.
Aug. 8, 2014 Office Action issued in U.S. Appl. No. 13/713,416.
Jul. 29, 2014 Office Action issued in Japanese Application No. 2012-077682.
Feb. 1, 2017 ecision on Appeal issued in U.S. Appl. No. 13/938,491.
Feb. 1, 2017 ecision on Appeal issued in U.S. Appl. No. 13/941,849.
Mar. 23, 2016 Examiner's Answer issued in U.S. Appl. No. 13/713,416.
Jun. 12, 2018 Office Action issued in U.S. Appl. No. 15/641,625.
Jan. 17, 2018 Office Action issued in U.S. Appl. No. 13/713,416.
M. Switkes et al., "Immersion lithography: Beyond the 65nm node with optics", Microlithography World. vol. 12 (2). May 2003.

* cited by examiner

EXPOSURE METHOD AND DEVICE MANUFACTURING METHOD HAVING LOWER SCANNING SPEED TO EXPOSE PERIPHERAL SHOT AREA

CROSS-REFERENCE TO RELATED APPLICATION

This is a Divisional of U.S. patent application Ser. No. 11/355,965 filed Feb. 17, 2006 (now U.S. Pat. No. 8,064,037), which in turn is a Continuation of International Application No. PCT/JP2004/012319, filed Aug. 20, 2004, which claims priority to Japanese Patent Application Nos. 2003-297507 (filed Aug. 21, 2003) and 2004-38411 (filed Feb. 16, 2004). The contents of each of the aforementioned applications are incorporated herein by reference in their entireties.

BACKGROUND OF THE INVENTION

Field of the Invention

The present invention relates to an exposure apparatus, an exposure method and a device manufacturing method in which a substrate is, with the substrate being irradiated with an exposure light, exposed.

Description of Related Art

Semiconductor devices and liquid crystal display devices are manufactured through the so-called photolithography technique, by which a pattern formed on a mask is transferred onto a photosensitive substrate. The exposure apparatus used in the photolithography process has a mask stage that supports a mask and a substrate stage that supports a substrate, and while successively moving the mask stage and the substrate stage, transfers the mask pattern, via a projection optical system, onto the substrate. In recent years, there has been demand for higher resolution projection optical systems in order to handle the much higher levels of integration of device patterns. As the exposure wavelength to be used is shorter, the resolution of the projection optical system becomes higher. As the numerical aperture of the projection optical system is larger, the resolution of the projection optical system becomes higher. Consequently, the exposure wavelength used in exposure apparatuses has shortened year by year, and the numerical aperture of projection optical systems has also increased. Furthermore, the currently mainstream exposure wavelength is the 248 nm KrF excimer laser, but an even shorter wavelength 193 nm ArF excimer laser is also being commercialized. In addition, as well as resolution, the depth of focus (DOF) is also important when performing an exposure. The resolution R and the depth of focus δ are respectively expressed by the following formulas:

$$R = k_1 \cdot \lambda / NA, \quad (1)$$

$$\delta = \pm k_2 \cdot \lambda / NA^2, \quad (2)$$

where λ the exposure wavelength, NA is the numerical aperture of the projection optical system, and $k_1$ and $k_2$ are process coefficients. It can be seen from formulas (1) and (2) that if, to enhance the resolution R, the wavelength λ is made shorter and the numerical aperture is made larger, then the depth of focus δ becomes narrower.

When the depth of focus δ becomes too narrow, it becomes difficult to make the substrate surface coincide with the image plane of the projection optical system, and thus there occurs the possibility that the focus margin during the exposure operation will be insufficient. To address this problem, the liquid immersion method, which is disclosed in, e.g., PCT International Publication No. WO99/49504, has been proposed as a method to make the exposure wavelength shorter in effect and to make the depth of focus broader. This liquid immersion method is designed, by filling the space between the under surface of the projection optical system and the substrate surface with a liquid, e.g., water or organic solvent, to form a liquid immersion region and thus by taking advantage of the fact that the wavelength of the exposure light in the liquid becomes 1/n times (n is the refractive index of the liquid and is generally about 1.2 to 1.6) of that in the air, improve the resolution and, at the same time, enlarge the depth of focus by approximately n times.

By the way, while, in the above-described prior art, the liquid immersion region is formed on the substrate, with the supply and recovery of the liquid being performed by a liquid supply device and a liquid recovery device, there is the possibility that, when the liquid is recovered, sound and/or vibration occur, and the occurred sound and/or vibration may affect the exposure accuracy and various kinds of measurement accuracies.

It is also important that the liquid can be adequately recovered for the purposes of maintaining the exposure accuracy and/or various kinds of measurement accuracies and/or preventing the pattern formed on the substrate from deteriorating. When the liquid cannot be completely recovered, there also arises the disadvantages, for example, that the liquid remaining on the substrate dries, leaving thereon an adhesion trace (water mark), or that the remaining liquid scatters to the neighboring mechanical parts and causes them to rust. Furthermore, when the liquid remains or scatters, it may bring about, for example, the variation of the ambience (humidity, etc.) in which the substrate is placed, resulting in the change of the refractive index on the optical path of the detecting light of the optical interferometers used for the stage position measurement, thus affecting the various measurement operations associated with the exposure process, causing the exposure accuracy to be lowered.

SUMMARY OF THE INVENTION

The present invention has been made in consideration of such situations, and its objective is to provide an exposure method, an exposure apparatus, and a device manufacturing method in which the exposure accuracy when a substrate is exposed by irradiating the substrate with an exposure light via a projection optical system and a liquid can be maintained.

An exposure apparatus of the present invention is an exposure apparatus that by irradiating an exposure light, via a projection optical system and a liquid, onto a substrate placed on the image plane side of the projection optical system, exposes the substrate, the exposure apparatus includes a liquid supply mechanism that supplies the liquid onto the substrate and a liquid recovery mechanism that recovers the liquid having been supplied on the substrate and wherein when the exposure light is being irradiated on the image plane side of the projection optical system, the recovery of the liquid by the liquid recovery mechanism is not performed.

According to the present invention, by not performing the recovery of the liquid by the liquid recovery mechanism when the exposure light is being irradiated on the image plane side of the projection optical system, sound and/or vibration due to the liquid recovery operation can be prevented from occurring during the exposure operation to the substrate, in which the exposure light is irradiated on the image plane side. Thus, the disadvantage that the exposure accuracy lowers due to the sound and/or vibration can be precluded. As for an operation in which the exposure light is irradiated on the image plane side of the projection optical system, there is, for example, other than the exposure operation to the substrate, the exposure light detection operation via the liquid by means of various light receiving sensors placed on the image plane side of the projection optical system. By not performing the liquid recovery operation by the liquid recovery mechanism also during this exposure light detection operation of the light receiving sensors, the disadvantage that the detection accuracy lowers due to sound and/or vibration can be prevented.

An exposure apparatus of the present invention is an exposure apparatus that by irradiating an exposure light, via a projection optical system and a liquid, on a substrate placed on the image plane side of the projection optical system, exposes the substrate, the exposure apparatus includes a substrate holding member that is movable while holding the substrate and a liquid recovery mechanism that has a recovery port above the substrate stage and recovers the liquid on the substrate and wherein after completion of the exposure of the substrate held by the substrate holding member, the substrate holding member and the recovery port of the substrate holding member are relatively moved.

According to the present invention, by, after completion of the exposure to the substrate, relatively moving the substrate holding member and the recovery port of the liquid recovery mechanism, the liquid that has not been recovered by the liquid recovery mechanism during the exposure and remained on the substrate or the substrate holding member can be recovered. Thus, the occurrence of the disadvantages, such as the occurrence of a water mark, rusting of the apparatus, and the variation of the ambience that are due to the liquid remained, can be prevented.

An exposure apparatus of the present invention is an exposure apparatus that by forming a liquid immersion region on a part of a substrate and by irradiating an exposure light to the substrate via a liquid forming the liquid immersion region and a projection optical system, exposes the substrate, the exposure apparatus includes a liquid supply mechanism that supplies, during the exposure of the substrate, the liquid onto the substrate and a liquid recovery mechanism that sucks and recovers, during the exposure of the substrate, the liquid on the substrate from above the substrate, and wherein during the exposure of the substrate, the liquid supply amount by the liquid supply mechanism is larger than the liquid recovery amount by the liquid recovery mechanism.

In the case of a configuration in which a liquid recovery mechanism recovers a liquid on a substrate by sucking the liquid from above the substrate, there may arise the situation in which the liquid is recovered together with gas surrounding the liquid, and the recovering of the liquid together with the gas, is regarded as a factor contributing the occurrence of sound and/or vibration. According to the present invention, with the liquid supply amount onto the substrate being made larger in proportion to the liquid recovered by the liquid recovery mechanism, together with the gas being made larger, and thus with the amount of the gas recovered being made smaller, the sound and/or vibration can be made reduced.

An exposure apparatus of the present invention is an exposure apparatus that by irradiating an exposure light to a substrate via a projection optical system and a liquid, exposes the substrate, the exposure apparatus includes a movable member that is placed on the image plane side of the projection optical system and holds the liquid between the movable member and the projection optical system and a liquid recovery mechanism that has a recovery port placed so as to face the surface of the movable member and is capable of recovering the liquid on the movable member, and wherein the liquid on the movable member is recovered, while relatively moving the movable member and the recovery port of the liquid recovery mechanism.

In accordance with this invention, the liquid on the movable member can be recovered more reliably, and thus the disadvantages due to the remaining liquid, such as the occurrence of an adhesion trace, can be suppressed.

A device manufacturing method of the present invention is characterized in that it uses the exposure apparatus described above. According to the present invention, the exposure process can be performed in a state that a high exposure accuracy is maintained, and thus devices that can bring about a desired performance can be provided.

An exposure method of the present invention is an exposure method that locally forms a liquid immersion region between the upper surface of a movable body that is movable while holding a substrate and a projection optical system, and by irradiating an exposure light on the substrate via the projection optical system and a liquid forming the liquid immersion region while moving the substrate relative to the exposure light, performs scanning exposure for each of a plurality of shot areas, wherein the moving speed of the substrate is determined in accordance with the position on the substrate of each of the plurality of shot areas.

It should be noted that the above-mentioned upper surface of the movable body also includes the surface of the substrate held by the movable body.

In accordance with this invention, because the moving speed of the substrate when each shot area is exposed is determined in accordance with the position on the substrate of the shot area, the shot area can be exposed, with the liquid being well held between the projection optical system and the upper surface of the movable body irrespective of the position on the substrate.

DETAILED DESCRIPTION OF THE INVENTION

Figure 1:
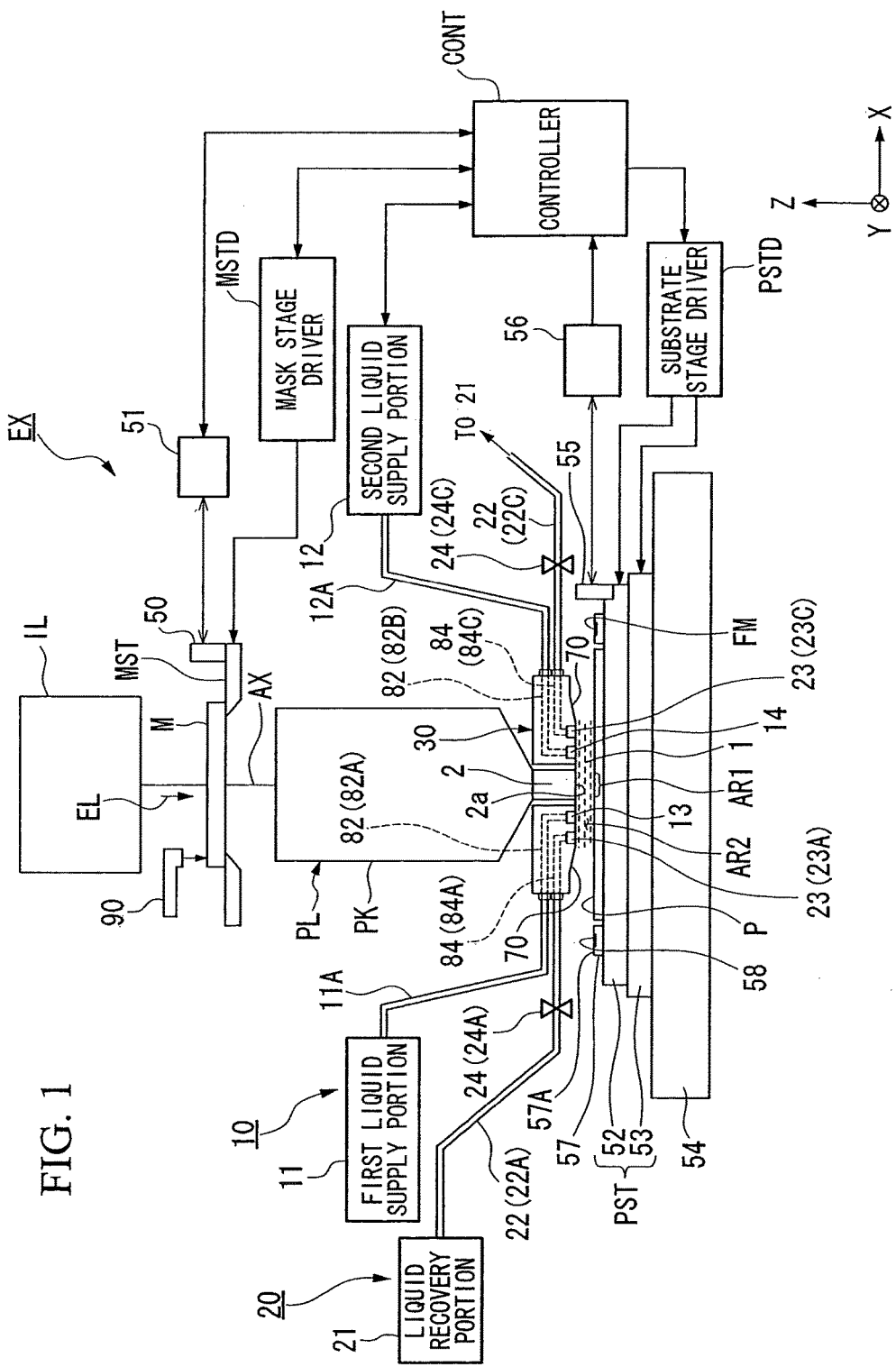
FIG. 1 is a schematic diagram showing an embodiment of an exposure apparatus of the present invention.

In the following, referring to the drawings, preferable embodiments of the present invention will be described. It should be noted, however, that the present invention is not limited only to the following embodiments, but the constituent elements of those embodiments may be appropriately combined.

FIG. 1 is a schematic diagram showing an embodiment of an exposure apparatus of the present invention.

Referring to FIG. 1, exposure apparatus EX is provided with mask stage MST that supports mask M, substrate stage PST that supports substrate P, illumination optical system IL that illuminates mask M supported by mask stage MST with exposure light EL, projection optical system PL that projection exposes a pattern image of mask M illuminated with exposure light EL onto substrate P supported by substrate stage PST, and controller CONT that controls the overall operation of exposure apparatus EX. Exposure apparatus EX of the embodiment is a liquid immersion exposure apparatus, to which a liquid immersion method is applied, with the exposure wavelength being shortened in effect, to improve the resolution and to widen the depth of focus and is provided with liquid supply system 10 that supplies liquid 1 onto substrate P and liquid recovery system 20 that recovers liquid 1 having been supplied on substrate P. Exposure apparatus EX, at least while transferring the pattern image of mask M onto substrate P, forms, by using liquid 1 supplied from liquid supply system 10, liquid immersion region AR2 on a portion (locally) on substrate P so as to include projection area AR1 of projection optical system PL. More specifically, exposure apparatus EX adopts a local liquid immersion method in which the space between optical element 2 located at the image plane side end of projection optical system PL and the surface (exposure surface) of substrate P placed on the image plane side is filled with liquid 1, and, by irradiating exposure light EL having passed through mask M to substrate P via liquid 1 between projection optical system PL and the substrate P, transfer-exposes the pattern of mask M onto substrate P.

The present embodiment will be described assuming, as an example, the case where as exposure apparatus EX, a scan type exposure apparatus (the so-called scanning stepper) in which while synchronously moving mask M and substrate P in mutually different directions (opposite directions) along the scanning directions, the pattern formed on mask M is exposed onto substrate P is used. It is to be noted that there may be, depending on the structure of projection optical system PL, a case where mask M and substrate P are moved in the same direction. In the following description, it is assumed that the direction that coincides with optical axis AX of projection optical system PL is referred to as the Z-axis direction, that the synchronous movement direction (the scanning direction), in a plane perpendicular to the Z-axis direction, of mask M and substrate P is referred to as the X-axis direction, and that the direction perpendicular to the Z-direction and to the X-direction is referred to as the Y-direction (the non-scanning direction). It should be noted that a "substrate" referred to herein comprehends a semiconductor wafer over which a photoresist, a photosensitive material, is applied and that a "mask" comprehends a reticle on which a device pattern to be reduction projected onto a substrate is formed.

Illumination optical system IL is for illuminating mask M supported by mask stage MST with exposure light EL and includes a light source for exposure, an optical integrator for uniforming the illuminance of a light flux emitted from the exposure light source, a condenser lens for condensing exposure light EL from the optical integrator, a relay lens system, a variable field stop for setting an illumination area on mask M formed by exposure light EL to be of a slit-like shape, etc. A specified illumination area on mask M is illuminated, by illumination optical system IL, with exposure light EL having a uniform illuminance distribution. As exposure light E L emitted from illumination optical system IL, for example, a bright line of ultraviolet region (g-line, h-line, i-line) emitted from a mercury lamp, a deep ultraviolet light (DUV light) such as a KrF excimer laser light (wavelength of 248 nm), and a vacuum ultraviolet light (VUV light) such as an ArF excimer laser light (wavelength of 193 nm) or an $F_2$ excimer laser light (wavelength of 157 nm) may be used. In the present embodiment, an ArF excimer laser light is used.

Mask stage MST is for supporting mask M, is two-dimensionally movable in a plane perpendicular to optical axis AX, i.e., in the XY-plane, and is finely rotatable in the θZ-direction. Mask stage MST is driven by mask stage driver MSTD such as a linear motor. Mask stage driver MSTD is controlled by controller CONT. On mask stage MST is set moving mirror 50. Further, laser interferometer 51 is provided at a position facing moving mirror 50. The two-dimensional position and the rotation angle of mask M on mask stage MST are measured by laser interferometer 51 in real time, and the measurement results are outputted to controller CONT. By driving mask stage driver MSTD based on the measurement results from laser interferometer 51, Controller CONT performs positioning of mask M supported by mask stage MST.

Projection optical system PL is for projection exposing the pattern of mask M onto substrate P at a predetermined projection magnification of β and is constituted by a plurality of optical elements, including optical element (lens) 2 disposed at the end portion on the substrate P side (image plane side of projection optical system PL), and those optical elements are supported by lens barrel PK. In the embodiment, projection optical system PL is a reduction system of which projection magnification β is, e.g., ¼ or ⅕. It should be noted that projection optical system PL may also be either a unit magnification system or a magnifying system. Note that optical element 2 at the end portion of projection optical system PL of the embodiment is detachably (exchangeably) disposed relative to lens barrel PK, and liquid 1 of liquid immersion region AR2 is in contact with optical element 2.

In the embodiment, purified water is used as liquid 1. Purified water can transmit not only an ArF excimer laser light but also, for example, a bright line of ultraviolet region (g-line, h-line, or i-line) emitted from a mercury lamp and a deep ultraviolet light (DUV light) such as a KrF excimer laser light (wavelength of 248 nm).

Optical element 2 is made of fluorite. Since fluorite has a high affinity for water, liquid 1 can be made to be in tight contact with substantially the entire surface of liquid contact surface 2a of optical element 2. More specifically, since, in the embodiment, it is configured such that liquid (water) 1 having a high affinity for liquid contact surface 2a of optical element 2 is supplied, the contact degree between liquid contact surface 2a of optical element 2 and liquid 1 is high, so that the optical path between optical element 2 and substrate P can be assuredly filled with liquid 1. It should be noted that optical element 2 may be made of quartz, which has a high affinity for water. Further, it may be configured such that liquid contact surface 2a of optical. element 2 is applied with hydrophilic (lyophilic) treatment to enhance the affinity for liquid 1.

Substrate stage PST is for supporting substrate P and is provided with Z stage 52 that holds substrate P via a substrate holder, XY stage 53 that supports Z stage 52, and base 54 that supports XY stage 53. Substrate stage PST is driven by substrate stage driver PSTD such as a linear motor. Substrate stag e driver PSTD is controlled by controller CONT. By driving Z stage 52, the Z-direction position (focus position) and the θX- and θY-direction positions of substrate P held by Z stage 52 are controlled. Further, by driving XY stage 53, the XY-direction position (the position in the direction substantially parallel to the image plane of projection optical system PL) of substrate P is controlled. More specifically, Z stage 52, by controlling the focus position and inclination angle of substrate P, makes the surface of substrate P to coincide with the image plane of projection optical system PL by means of an autofocus system and an autoleveling system. X Y stage 53 performs positioning of substrate P in the X-axis and Y-axis directions. It is to be noted that needless to say, the Z stage and the XY stage may be integrally constructed.

On substrate stage PST (Z stage 52) is set moving mirror 55. Further, laser interferometer 56 is positioned at a position facing moving mirror 55. The two-dimensional position and the rotation angle of substrate P on substrate stage PST are measured by laser interferometer 56 in real time, and the measurement results are outputted to controller CONT. By driving substrate stage driver PSTD based on the measurement results from laser interferometer 56, Controller CONT performs positioning of substrate P supported by substrate stage PST.

Further, on substrate stage PST (Z stage 52) is provided annular plate portion 57 so as to surround substrate P. Plate portion 57 has flat surface 57A of which height is substantially equal to that of the surface of the substrate P held by the substrate holder. Although there is a gap of about from 0.1 to 1 mm between the edge of substrate P and plate portion 57, liquid 1 hardly flows into the gap by virtue of the surface tension of liquid 1, and thus, even when exposing the peripheral portion of substrate P, liquid 1 can be held beneath projection optical system PL with the aid of plate portion 57.

Liquid supply mechanism 10 is for supplying the predetermined liquid 1 on substrate P and is provided with first liquid supply portion 11 and second liquid supply portion 12 that are capable of delivering liquid 1 and with first supply pipe 11A and second supply pipe 12A each of which one end portion is connected to first liquid supply portion 11 and second liquid supply portion 12, respectively. E ach of first liquid supply portion 11 and second liquid supply portion 12 has a tank that stores liquid 1, a pressurizing pump, etc.

Liquid recovery mechanism 20 is for recovering liquid 1 having been supplied on substrate P and is provided with liquid recovery portion 21 that is capable of recovering liquid 1 and with recovery pipes 22 (first to fourth recovery pipes 22A-22D) of which one end portion is connected to liquid recovery portion 21. At the intermediate positions of recovery pipes 22 (first to fourth recovery pipes 22A-22D) are provided bulbs 24 (first to fourth bulbs 24A-24D). Liquid recovery portion 21 has a vacuum system (suction device) such as a vacuum pump, a tank that stores liquid 1 having been recovered, etc.

Flow path forming member 30 is placed in the vicinity of optical element 2 located at the end portion of projection optical system PL.

Flow path forming member 30 is an annular member provided so as to surround, above substrate P (substrate stage PST), optical element 2. Flow path forming member 30 is provided with first supply port 13 and second supply port 14 that are provided above substrate P (substrate stage PST) and are disposed so as to face the surface of the substrate P (substrate stage PST). Further, flow path forming member 30 has therein supply flow paths 82 (82A, 82B). One end portion of supply flow path 82A is connected to first supply port 13; the other end portion is connected to first liquid supply portion 11 via first supply pipe 11A. One end portion of supply flow path 82B is connected to second supply port 14; the other end portion is connected to second liquid supply portion 12 via second supply pipe 12A. Flow path forming member 30 is provided with recovery ports 23 that are provided above substrate P (substrate stage PST) and are disposed so as to face the surface of the substrate P (substrate stage PST). In the embodiment, flow path forming member 30 has four recovery ports, 23A-23D. Flow path forming member 30 also has therein recovery flow paths 84 (84A-84D) corresponding to recovery ports 23 (23A-23D). One end portions of recovery flow paths 84A-84D are connected to recovery ports 23A-23D, respectively; the other end portions are each connected to liquid recovery portion 21 via recovery pipes 22A-22D. In the embodiment, flow path forming member 30 constitutes a portion of each of liquid supply mechanism 10 and liquid recovery mechanism 20.

It should be noted that while, in the embodiment, first to fourth recovery pipes 22A-22D are connected to a single liquid recovery portion 21, it may also be configured such that a plurality of (in this case, four) liquid recovery portions 21 corresponding to the number of the recovery pipes, and each of first to fourth recovery pipes 22A-22D is connected to each of said plurality of liquid recovery portions 21.

First to fourth bulbs 24A-24D provided to first to fourth recovery pipes 22A-22D respectively open and close the flow paths of first to fourth recovery pipes 22A-22D, and the operations of the bulbs are controlled by controller CONT. While the flow paths of recovery pipes 22 (22A-22D) are being opened, liquid recovery mechanism 20 is capable of sucking and recovering liquid 1 from recovery ports 23 (23A-23D); when the flow paths of recovery pipes 22 (22A-22D) are closed by bulbs 24 (24A-24D), the sucking and recovering of liquid 1 via recovery ports 23 (23A-23D) is stopped.

The liquid supply operations of first liquid supply portion 11 and second liquid supply portion 12 are controlled by controller CONT. Controller CONT can control each of the per-unit-time liquid supply amounts onto substrate P by first liquid supply portion 11 and second liquid supply portion 12, independently of each other. Liquid 1 delivered from first liquid supply portion 11 and second liquid supply portion 12 is supplied on substrate P (substrate stage PST) from supply ports 13 and 14 provided above substrate P, via supply pipes 11A and 12A and supply flow paths 82A and 82B of flow path forming member 30.

Further, the liquid recovery operation of liquid recovery portion 21 is controlled by controller CONT. Controller CONT can control the per-unit-time liquid recovery amount by liquid recovery portion 21. Liquid 1 that had been on substrate P (substrate stage PST) and has been recovered from recovery ports 23 provided over substrate P (substrate stage PST) is recovered into liquid recovery portion 21, via recovery flow paths 84 of flow path forming member 30.

On the under surface of flow path forming member 30, that is arranged, relative to projection optical system PL, outside of recovery ports 23 (the surface facing the side of substrate P) is formed liquid trapping surface 70 with a predetermined length that captures liquid 1. Trapping surface 70 is a surface that is inclined relative to the XY-plane and is inclined such that the trap surface 31 is inclined to make separation from the surface of the substrate P (to be directed upwardly) at outer positions with respect to the projection area AR1 (liquid immersion area AR2). Trapping surface 70 is applied with lyophilic treatment. Because the films (photoresist, anti-reflection films, etc.) coated on the surface of substrate P are usually water-repellent (liquid-repellent), liquid 1 having flowed out to the outside of recovery ports 23 is captured by trapping surface 70. It is to be noted that since liquid 1 of the embodiment is water having a large polarity, by forming a thin film with a substance with a molecular structure having a large polarity, e.g., alcohol, as hydrophilic (lyophilic) treatment applied to trapping surface 70, hydrophilicity is given to the trapping surface 70. More specifically, when water is used as liquid 1, a treatment in which a substance with a molecular structure having a large polarity, e.g., an OH group, is disposed on the surface is desirable.

Figure 2:
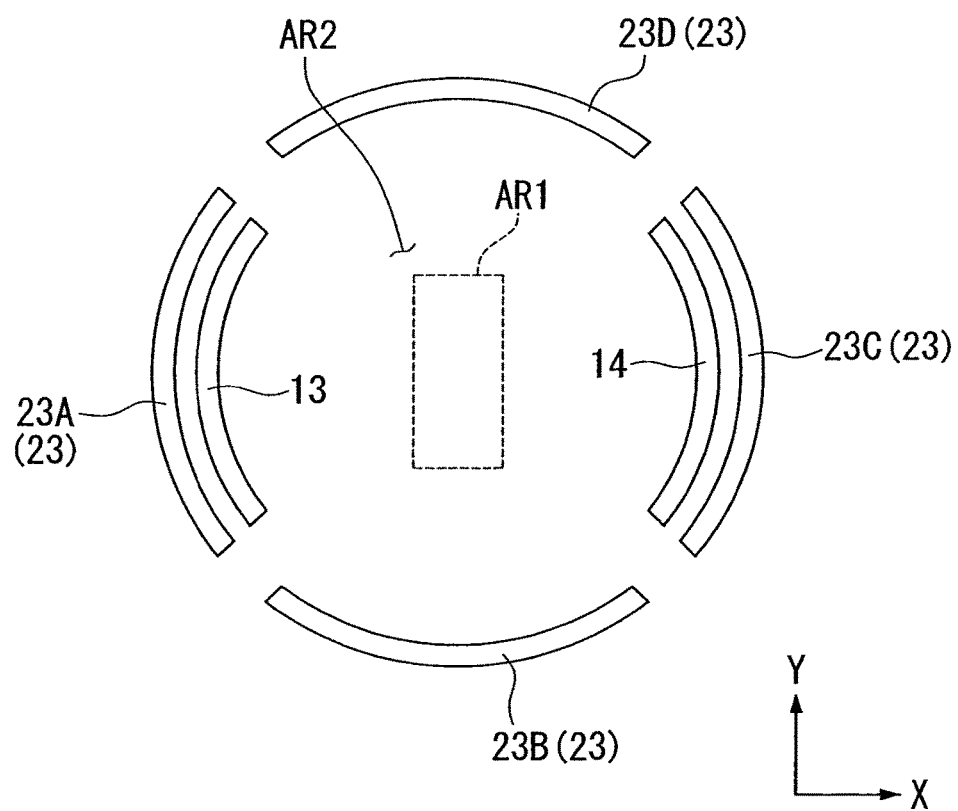
FIG. 2 is a plan view for explaining a layout of liquid supply ports and recovery ports.

FIG. 2 is a plan view showing the positional relationship between first and second supply ports 13 and 14 formed on flow path forming member 30 and first to fourth recovery ports 23A-23D, and projection area AR1 of projection optical system PL. In FIG. 2, projection area AR1 of projection optical system PL is set to be rectangle-shaped, having its longitudinal direction in the Y-direction (non-scanning direction). Liquid immersion region AR2 filled with liquid 1 is formed locally on a part on substrate P within the area surrounded substantially by the four recovery ports 23A-23D, so as to include projection area AR1. First supply port 13 is disposed on one scanning direction side (−X side) relative to projection area AR1, and second supply port 14 is disposed on the other side (+X side). In other words, first and second supply ports 13 and 14 are each disposed on either one of the both sides of projection area AR1 so that projection area AR1 is, relative to the scanning direction (the X-direction), located therebetween. The lengths of first and second supply ports 13 and 14 in the Y-direction are at least longer than the length of projection area AR1 in the Y-direction. Liquid supply mechanism 10 can simultaneously supply liquid 1 on both sides of projection area AR1 from first and second supply ports 13 and 14.

First to fourth recovery ports 23A-23D are disposed so as to surround supply ports 13 and 14 and projection area AR1. Among the plurality of (four) recovery ports 23A-23D, first recovery port 23A and third recovery port 23C are each disposed, relative to the X-direction, on either one of the both sides of projection area AR1, with projection area AR1 being located therebetween; second recovery port 23B and fourth recovery port 23D are each disposed, relative to the Y-direction, on either one of the both sides of projection area AR1, with projection area AR1 being located therebetween. Supply ports 13 and 14 are configured such that supply port 13 is disposed between projection area AR1 and recovery port 23A, and supply port 14 is disposed between projection area AR1 and recovery port 23C. Recovery ports 23A-23D are each formed to have a slit-like shape that is substantially arc-shaped when viewed from the top and has a predetermined length. The length of recovery ports 23A and 23C in the Y-direction is longer than the length of supply ports 13 and 14 in the Y-direction. Recovery ports 23B and 23D are each formed to have substantially the same length as recovery ports 23A and 23C. Each of first to fourth recovery ports 23A-23D is connected to liquid recovery portion 21, via each of first to fourth recovery pipes 22A-22D.

It should be noted that while, in the embodiment, each of the plurality of recovery ports 23A and 23D is formed to have substantially the same size (length), they may have sizes different from each other. Further, the number of recovery ports 23 is not restricted to four, and any number of multiple recovery ports may be provided so long as they are disposed such that they surround projection area AR1 and supply ports 13 and 14. While, in FIG. 2, the slit-width of the supply ports (13, 14) and the slit-width of the recovery ports (23A-23D) are approximately the same, the slit-width of the recovery ports (23A-23D) may be made larger than the slit-width of the supply ports (13, 14).

Figure 3:
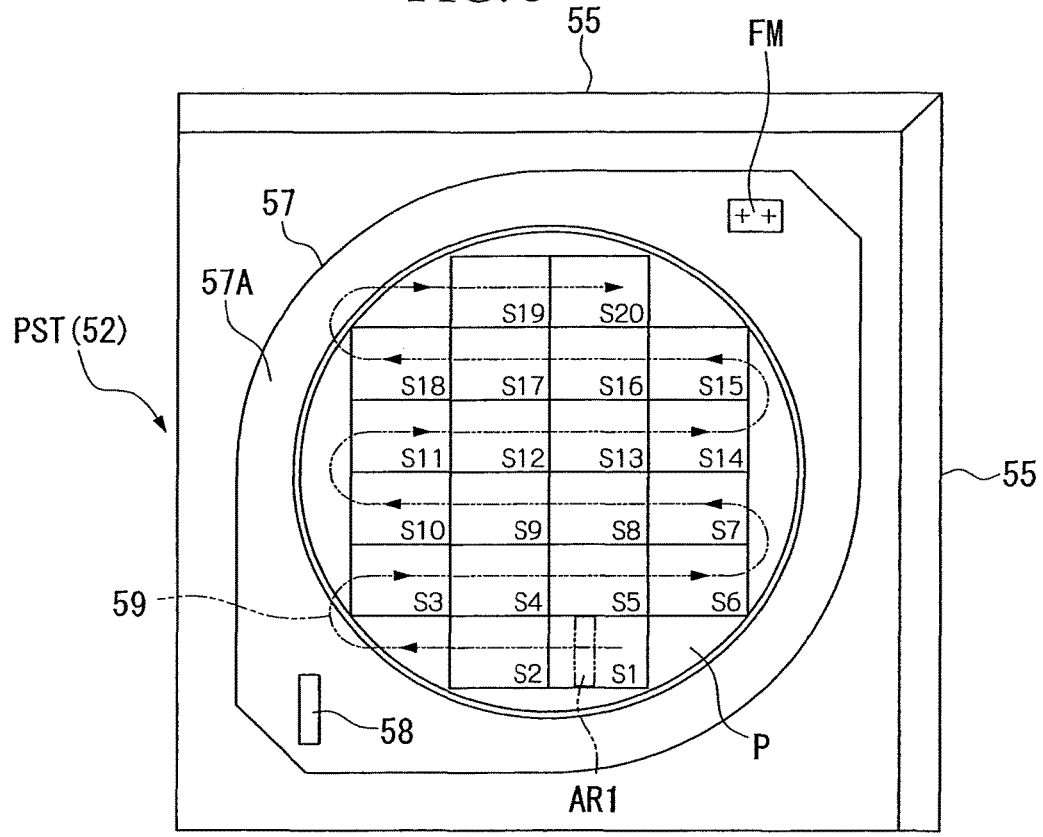
FIG. 3 is a plan view of a substrate stage.

FIG. 3 is a plan view of Z stage 52 of substrate stage PST, when viewed from above. Moving minors 55 are disposed on the edge portions of Z stage 52 that is rectangle-shaped when viewed from the top, which portions are perpendicular to each other. And, in substantially the center portion of Z stage 52 is positioned substrate P; annular plate portion 57 that has flat surface 57A of which height is substantially equal to the surface of substrate P is provided integrally with Z stage 52, so as to surround substrate P.

Two corners of flat surface 57A of plate portion 57 are made to be wide; and on one of the wide portions is provided fiducial mark FM that is used when mask M and substrate P are aligned relative to a predetermined position. Fiducial mark FM is detected by mask alignment system 90 (see FIG. 1) provided above mask M, via mask M and projection optical system PL. That is, mask alignment system 90 constitutes an alignment system of the so-called TTM (Through the Mask) type (also called the TTR (Through the Reticle) type). It is to be noted that, although not shown, exposure apparatus EX is also provided with an off-axis type substrate alignment system that is disposed on a side of projection optical system PL and is capable of detecting alignment marks formed on substrate P and fiducial mark FM.

Further, on the other wide portion in flat surface 57A of plate portion 57 is provided light sensor portion 58. Light sensor portion 58 is for detecting the exposure light EL having passed through projection optical system PL and is constituted by an illuminance sensor that detects the irradiated light amount (illuminance) of the exposure light EL on the image plane side of projection optical system PL or by an illuminance non-uniformity sensor that detects the illuminance distribution (illuminance non-uniformity) of projection area AR1. Light sensor portion 58 is provided with a transparent member that is provided on plate portion 57, has substantially the same height as the surface of substrate P, and is capable of transmitting exposure light EL and with a light receiving device that is embedded in Z stage 52

(substrate stage PST) and receives the exposure light EL having passed through the above-described transparent member. It is to be noted that although, in the embodiment, fiducial mark FM is positioned on plate portion 57, a fiducial mark member, separate from plate portion 57, for disposing fiducial mark FM may be provided on substrate stage PST. Similarly, light sensor portion 58 may be provided on a separate position located differently from the plate portion 57, on substrate stage PST.

As shown in FIG. 3, a plurality of shot areas S1-S20 are set on substrate P, and controller CONT sequentially exposes the plurality of shot areas S1-S20 on substrate P. In the embodiment, controller CONT moves substrate stage PST while monitoring the outputs from laser interferometers 56 so that the optical axis AX (projection area AR1) of projection optical system PL proceeds along the broken line arrow 59 of FIG. 3 and sequentially exposes the plurality of shot areas S1-S20.

Figure 4:
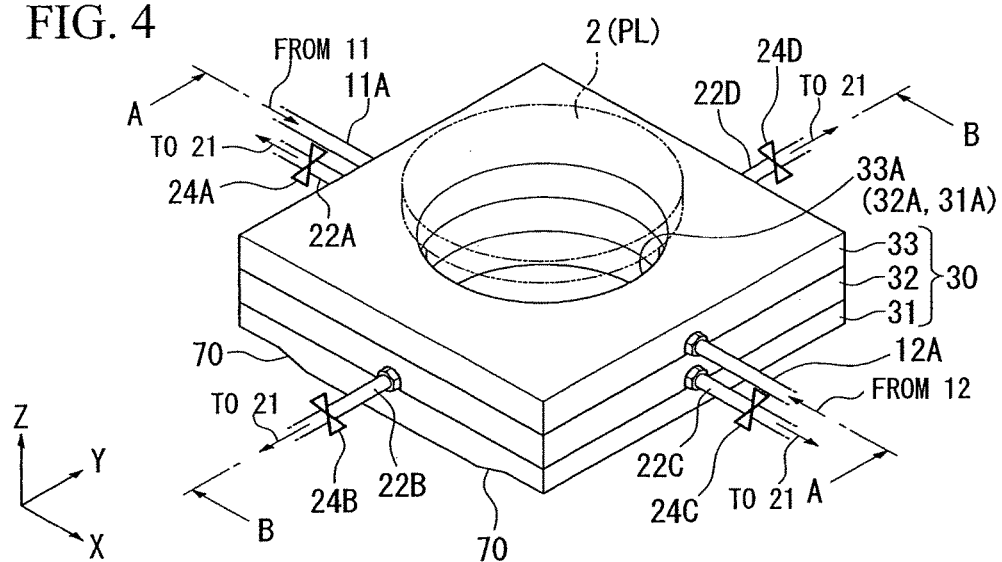
FIG. 4 is a perspective view showing a flow path forming member constituting a liquid supply mechanism and a liquid recovery mechanism.

FIG. 4 is an outline perspective view of flow path forming member 30.

As shown in FIG. 4, flow path forming member 30 is annular member provided so as to surround the optical element 2 located at the end portion of projection optical system PL and is provided with first member 31, the second member 32 that is positioned on the upper portion of first member 31, and the third member 33 that is positioned on the upper portion of second member 32. The first to third members constituting flow path forming member 30 are each a plate-shaped member and have, in the center portions thereof, the hole portions 31A-33A, respectively, capable of disposing projection optical system PL (optical element 2). At the intermediate positions of first to fourth recovery pipes 22A-22D are provided first to fourth bulbs 24A-24D, respectively.

Figure 5:
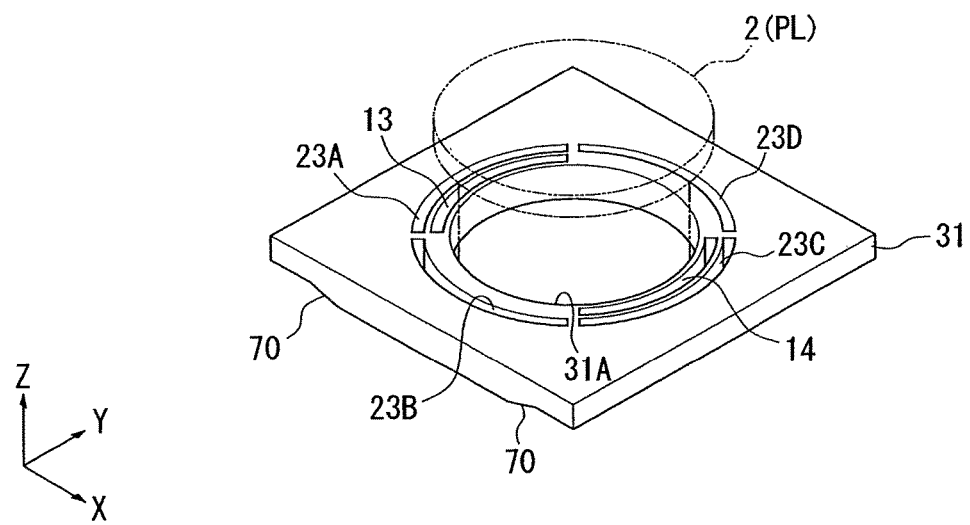
FIG. 5 is a perspective view showing a first member included in the flow path forming member.

FIG. 5 is a perspective view showing first member 31, among first to third members, which is positioned at the lowermost level.

First member 31 is provided with first supply port 13 that is formed on the −X side of projection optical system PL and supplies liquid 1 onto substrate P and with second supply port 14 that is formed on the +X side of projection optical system PL and supplies liquid 1 onto substrate P. Each of first supply port 13 and second supply port 14 is a through hole that penetrates first member 31 and is formed to be arc-shaped when viewed from the top. Further, first member 31 is provided with first recovery port 23A that is formed on the −X side of projection optical system PL and recovers liquid 1 on substrate P, with second recovery port 23B that is formed on the −Y side of projection optical system PL and recovers liquid 1 on substrate P, with third recovery port 23C that is formed on the +X side of projection optical system PL and recovers liquid 1 on substrate P, and with fourth recovery port 23D that is formed on the +Y side of projection optical system PL and recovers liquid 1 on substrate P. Each of first to fourth recovery ports 23A-23D is also a through hole that penetrates first member 31 and is formed to be substantially arc-shaped when viewed from the top, and those recovery ports are provided substantially equidistantly along the circumference of projection optical system PL. Still further, each of first to fourth recovery ports 23A-23D is provided more outward relative to projection optical system PL, compared with supply ports 13 and 14. The distance between supply ports 13 and 14 and substrate P and the distance between recovery ports 23A-23D and substrate P are set to be substantially equal to each other. Namely, the height position of supply ports 13 and 14 and the height position of recovery ports 23A-23D are set to be substantially equal to each other.

Figure 6A:
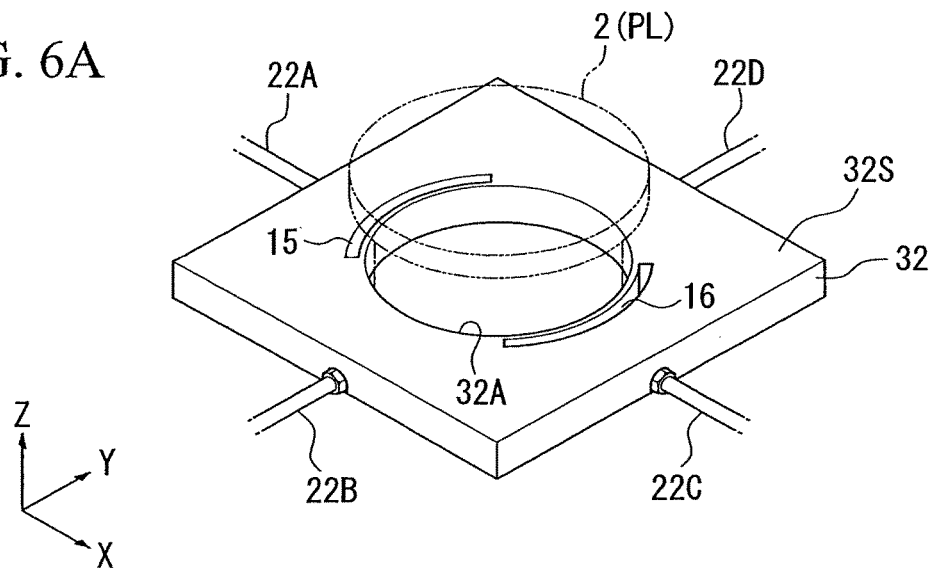
FIGS. 6A and 6B are perspective views showing a second member included in the flow path forming member.
Figure 6B:
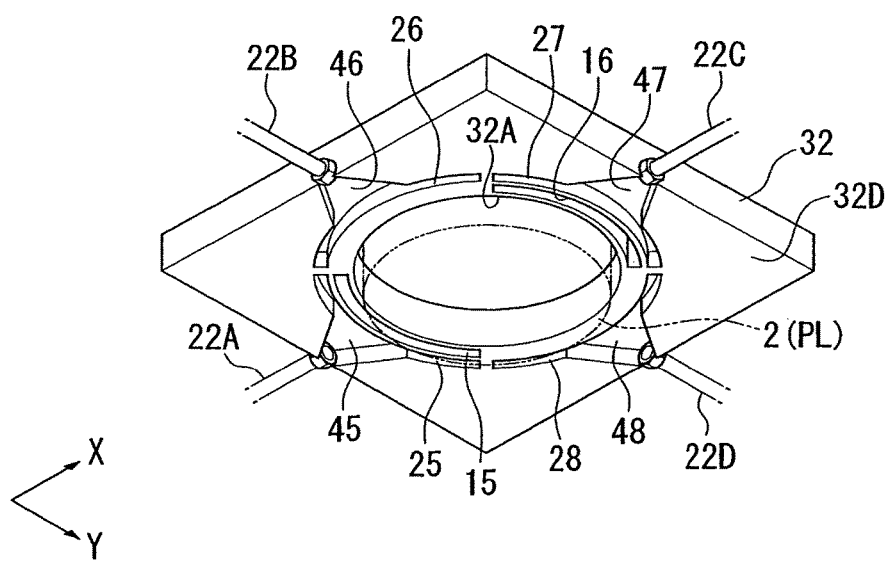

FIGS. 6A and 6B are perspective views showing second member 32, among first to third members, which is positioned at the middle level; FIG. 6A is a perspective view when viewed from above, and FIG. 6B is a perspective view when viewed from below. Second member 32 is provided with first supply hole portion 15 that is formed on the −X side of projection optical system PL and connects to first supply port 13 of first member 31 when first member 31 and second member 32 are connected and with second supply hole portion 16 that is formed on the +X side of projection optical system PL and connects to second supply port 14 of first member 31. First and second supply hole portions 15 and 16 are through holes, and the shapes and sizes thereof when viewed from the top correspond to those of first and second supply ports 13 and 14. In other words, first and second supply hole portions 15 and 16 constitute slit-like flow paths of arc shape when viewed from the top.

As shown in FIG. 6B, on the −X side of projection optical system PL, of under surface 32D of second member 32, is formed first recovery groove portion 25 that connects to first recovery port 23A of first member 31 when first member 31 and second member 32 are connected; on the −Y side of projection optical system PL is formed second recovery groove portion 26 that connects to second recovery port 23B of first member 31; on the +X side of projection optical system PL is formed third recovery groove portion 27 that connects to third recovery port 23C of first member 31; and on the +Y side of projection optical system PL is formed fourth recovery groove portion 28 that connects to fourth recovery port 23D of first member 31. Each of first to fourth recovery groove portions 25-28 is formed to be substantially arc-shaped when viewed from the top so as to correspond to the respective shapes and sizes of first to fourth recovery ports 23A-23D, and those recovery groove portions are provided substantially equidistantly along the circumference of projection optical system PL. Further, first recovery pipe 22A and first recovery groove portion 25 are connected via taper-shaped groove portion 45. Taper-shaped groove portion 45 is formed such that it progressively extends in the horizontal direction, in the course of from the connection interface with first recovery pipe 22A to first recovery groove portion 25. Similarly, second recovery pipe 22B and second recovery groove portion 26 are connected via taper-shaped groove portion 46; third recovery pipe 22C and third recovery groove portion 27 are connected via taper-shaped groove portion 47; and fourth recovery pipe 22D and fourth recovery groove portion 28 are connected via taper-shaped groove portion 48.

Figure 7A:
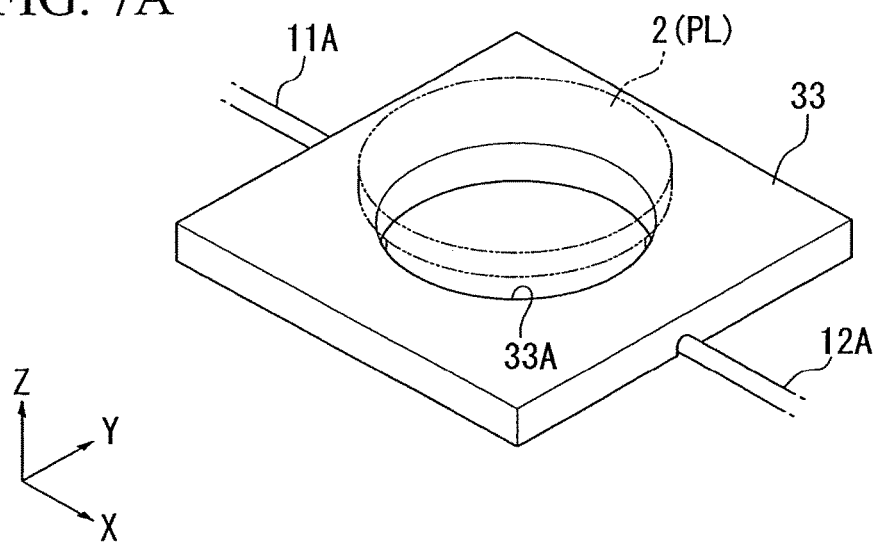
FIGS. 7A and 7B are perspective views showing a third member included in the flow path forming member.
Figure 7B:
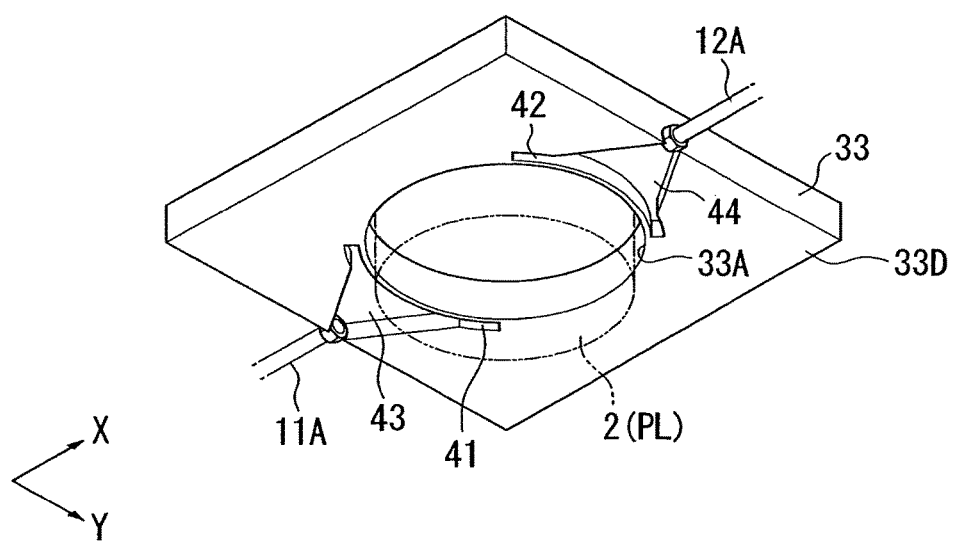

FIGS. 7A and 7B are perspective views showing third member 33, among first to third members, which is positioned at the uppermost level; FIG. 7A is a perspective view when viewed from above, and FIG. 7B is a perspective view when viewed from below. On the −X side of projection optical system PL, of under surface 33D of third member 33, is formed first supply groove portion 41 that connects to first supply hole portion 15 of second member 32 when second member 32 and third member 33 are connected; and on the +X side of projection optical system PL is formed second supply groove portion 42 that connects to second supply hole portion 16 of second member 32. The shape and size of each of first and second supply groove portions 41 and 42 are formed to be substantially arc-shaped when viewed from the top so as to respectively correspond to first and second supply hole portions 15 and 16 (by extension, to first and second supply ports 13 and 14). Further, first supply pipe 11A and first supply groove portion 41 are connected via taper-shaped groove portion 43. Taper-shaped groove portion 43 is formed such that it progressively extends in the horizontal direction, in the course of from the connection interface with first supply pipe 11A to first supply groove portion 41.

Similarly, second supply pipe 12A and second supply groove portion 42 are connected via taper-shaped groove portion 44.

First to third members 31-33 are formed of a metal such as stainless steel, titanium, aluminum, or alloy including them; the hole portions and groove portions of the members 31-33 are formed by, e.g., electric discharge machining. By processing each of the members 31-33 by electric discharge machining and then by connecting the members 31-33 by using an adhesive or fastening members, flow path forming member 30 is formed. It is to be noted that the surfaces coming into contact with the liquid are preferably applied with electrolytic polishing treatment or nonconductor oxide film treatment. Furthermore, each members of liquid supply mechanism 10 and liquid recovery mechanism 20, including flow path forming member 30, may be formed of synthetic resin such as polytetrafluoroethylene.

With the members 31-33 being connected, taper-shaped groove portion 43, first supply groove portion 41, first supply hole portion 15, and first supply port 13 are sequentially connected, and by them, first supply flow path 82A that connects to first supply pipe 11A is formed. Similarly, with taper-shaped groove portion 44, second supply groove portion 42, second supply hole portion 16, and second supply port 14 being sequentially connected, second supply flow path 82B that connects to second supply pipe 12A is formed. And thus, each liquid 1 delivered from each of first and second liquid supply portions 11 and 12 is supplied from above substrate P onto substrate P, via first and second supply pipes 11A and 12A and first and second supply flow paths 82A and 82B.

Further, with taper-shaped groove portion 45, first recovery groove portion 25, and first recovery port 23A being sequentially connected, first recovery flow path 84A that connects to first recovery pipe 22A is formed. Similarly, with taper-shaped groove portion 46, second recovery groove portion 26, and second recovery port 23B being sequentially connected, second recovery flow path 84B that connects to second recovery pipe 22B is formed; with taper-shaped groove portion 47, third recovery groove portion 27, and third recovery port 23C being sequentially connected, third recovery flow path 84C that connects to third recovery pipe 22C is formed; and with taper-shaped groove portion 48, fourth recovery groove portion 28, and fourth recovery port 23D being sequentially connected, fourth recovery flow path 84D that connects to fourth recovery pipe 22D is formed. And thus, liquid 1 on substrate P is sucked and recovered from above substrate P, via each of the above-described first to fourth recovery flow paths 84A-84D and first to fourth recovery pipes 22A-22D.

In this regard, because to first and second supply pipes 11A and 12A are connected taper-shaped groove portions 43 and 44, respectively, the liquid supply operation can be performed, with the flow quantity distribution and the flow velocity distribution being made uniform over the entire area of supply ports 13 and 14 of which longitudinal directions lies in the Y-direction. Similarly, because to recovery pipes 22A-22D are connected taper-shaped groove portions 45-48, respectively, the liquid recovery operation can be performed, with a uniform recovery force.

Figure 8:
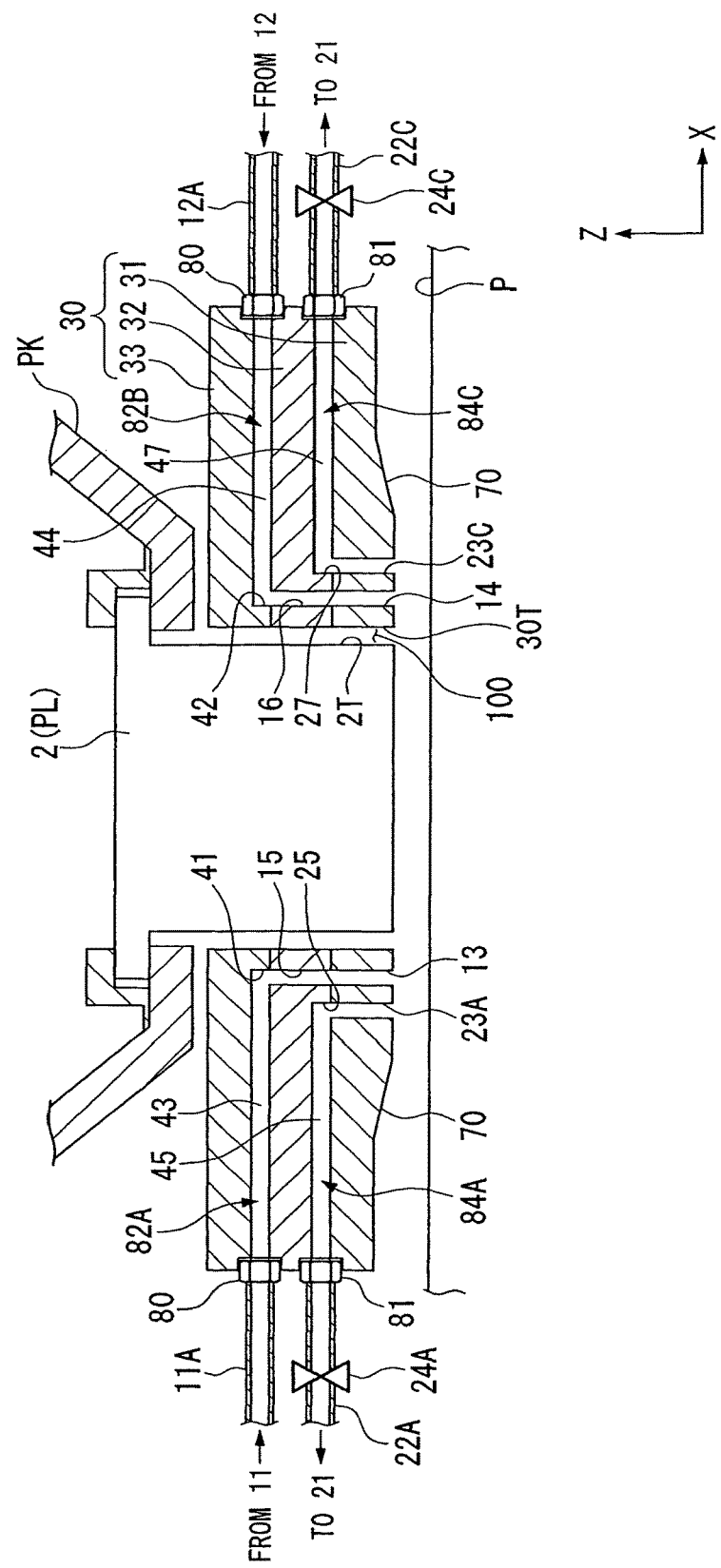
FIG. 8 is a cross sectional view taken along A-A arrow of FIG. 4.
Figure 9:
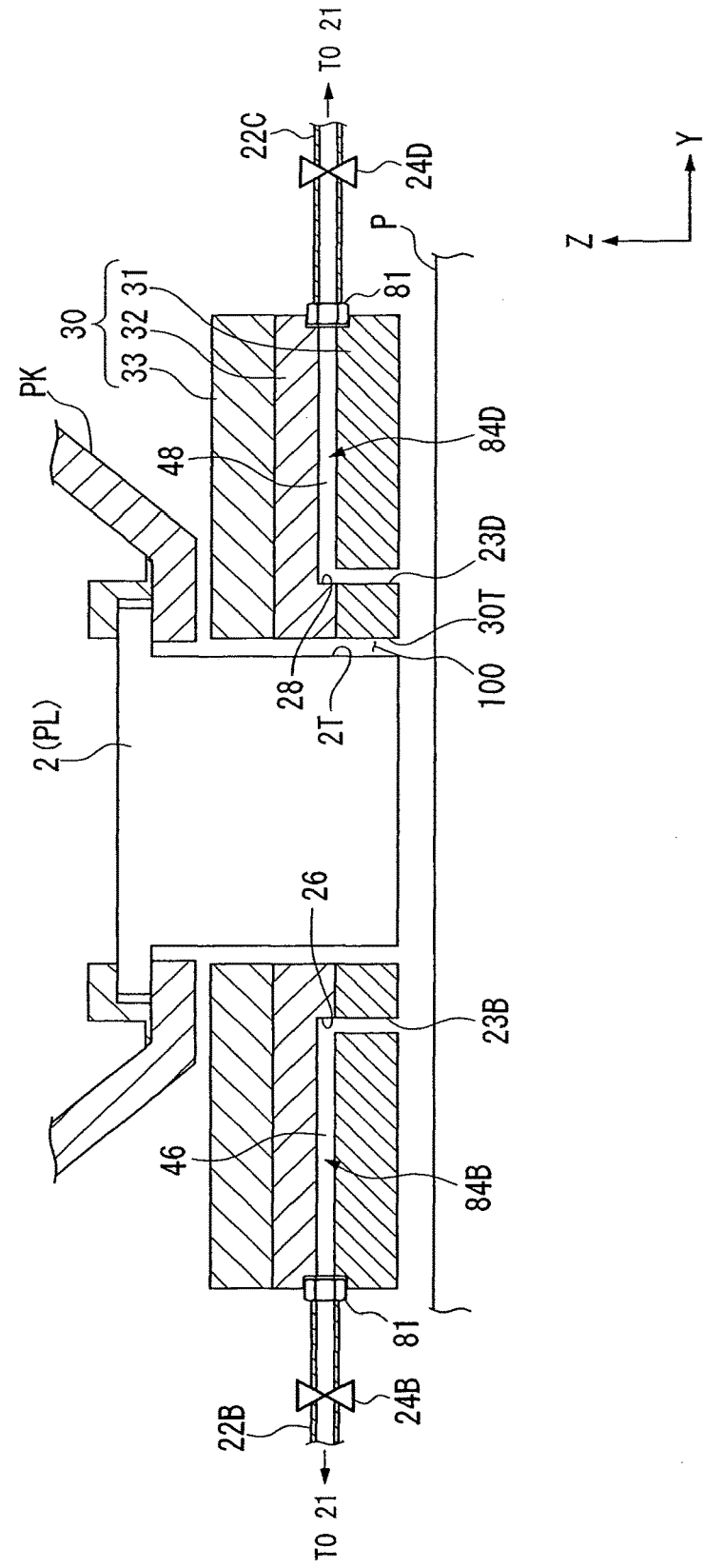
FIG. 9 is a cross sectional view taken along B-B arrow of FIG. 4.

FIG. 8 is a cross sectional view taken along A-A arrow of FIG. 4; FIG. 9 is a cross sectional view taken along B-B arrow of FIG. 4. Note that while, in the description below, of flow path forming member 30, second supply flow path 82B and third recovery flow path 84C that are provided on the +X side of projection optical system PL will be described, each of first supply flow path 82A provided on the −X side of projection optical system PL, first recovery flow path 84A on the −X side, second recovery flow path 82B on the −Y side, and fourth recovery flow path 82D on the +Y side has an equivalent configuration.

In FIG. 8, second supply flow path 82B is constituted by the above-described taper-shaped groove portion 44, second supply groove portion 42, second supply hole portion 16, and second supply port 14. Liquid 1 having been delivered from second liquid supply portion 12 flows into second supply flow path 82B via the second supply pipe. Liquid 1 having flowed into second supply flow path 82B flows, in taper-shaped groove portion 44 of second supply flow path 82B, in substantially the horizontal direction (XY-plane direction), is then bent substantially perpendicularly in the vicinity of second supply groove portion 42, then flows in the vertical direction (-Z direction) in second supply hole portion 16 and second supply port 14, and is finally supplied from above substrate P onto substrate P.

Third recovery flow path 84C is constituted by the above-described third recovery port 23C, third recovery groove portion 27, and taper-shaped groove portion 47. With liquid recovery portion 21 having the vacuum system being driven, liquid 1 on substrate P flows vertically and upward (+Z direction) into third recovery flow path 84C, via third recovery port 23C provided over the substrate P. In this process, together with liquid 1 on substrate P, gas (air) surrounding the liquid also flows into the third recovery port 23C (and is recovered). With respect to liquid 1 having flowed into recovery flow path 84C, the flow direction thereof is changed in the vicinity of third recovery groove portion 27, and the liquid flows, in taper-shaped groove portion 47, in substantially the horizontal direction. Thereafter, the liquid is sucked and recovered by and into liquid recovery portion 21, via third recovery pipe 22C.

Small gap 100 is formed between the internal surface 30T of flow path forming member 30 and the side surface 2T of the end portion optical element 2, of projection optical system PL, which comes into contact with liquid 1. Small gap 100 is provided for isolating, in terms of vibration, optical element 2 of projection optical system PL from flow path forming member 30, and by this, vibrations having occurred in liquid supply mechanism 10 and/or liquid recovery mechanism 20 can be prevented from transmitting to projection optical system PL. Each of liquid supply mechanism 10 and liquid recovery mechanism 20, which include flow path forming member 30, is supported by a supporting member other than projection optical system PL and other than a supporting member that supports projection optical system PL.

It should be noted that on the upper portions of the internal surface 30T of flow path forming member 30 and the side surface 2T of optical element 2, which form small gap 100, are preferably applied with liquid-repellent (water-repellent) treatment. As the liquid-repellent treatment, for example, coating treatment using a material having liquid-repellency can be listed. As the material having liquid-repellency, there can be listed, for example, fluorine compounds, silicon compounds, and synthetic resins such as polyethylene. Further, the thin film may be a single layer film or a film consisting of multiple layers. With at least one of the internal surface 30T of flow path forming member 30 and the side surface 2T of optical element 2 being applied with liquid-repellent (water-repellent) treatment in this way, leakage of the liquid from the upper portion of small gap 100 can be prevented. It is to be noted that a seal member such as an O-ring may be disposed to small gap 100 such that the seal member surrounds optical element 2.

Next, there will be described a method in which by using the above-described exposure apparatus EX, the pattern on mask M is exposed onto substrate P.

Exposure apparatus EX of the present embodiment projection exposes the pattern image of mask M onto substrate P while moving mask M and substrate P in the X-direction (scanning direction); and, during scanning exposure, a pattern image of a part of mask M is projected onto the rectangle-shaped projection area AR1 formed beneath the end portion of projection optical system PL, and in synchronization with the movement of mask M in the −X direction (or in the +X direction) at speed V, substrate P moves, via XY stage 53, in the +X direction (or in the −X direction) at speed β·V (β is the projection magnification).

As shown in FIG. 3, on substrate P are set the plurality of shot areas S1-S20; after completion of exposure of one shot area, a next shot area moves to the scan starting position through the stepping movement of substrate P; and, in this way, the scanning exposure process of each shot area is successively performed, with substrate P being moved in accordance with the step-and-scan method.

In performing the exposure process, controller CONT drives liquid supply mechanism 10 to start the liquid supply operation of supplying the liquid onto substrate P. Liquid 1 delivered from each of first and second liquid supply portions 11 and 12 of liquid supply mechanism 10 is, after flowing through supply pipes 11A and 12A, supplied onto substrate P, via supply flow paths 82A and 82B formed inside flow path forming member 30. It is to be noted that the supply of liquid 1 may be initiated on flat surface 57A of plate portion 57.

Liquid 1 supplied on substrate P flows beneath projection optical system PL in accordance with the movement of substrate P. For example, when substrate P is moving in the X-direction during exposure of a given shot area, liquid 1 flows beneath projection optical system PL in the same direction as substrate P, i.e., in the X-direction, and at substantially the same speed as substrate P.

Figure 10:
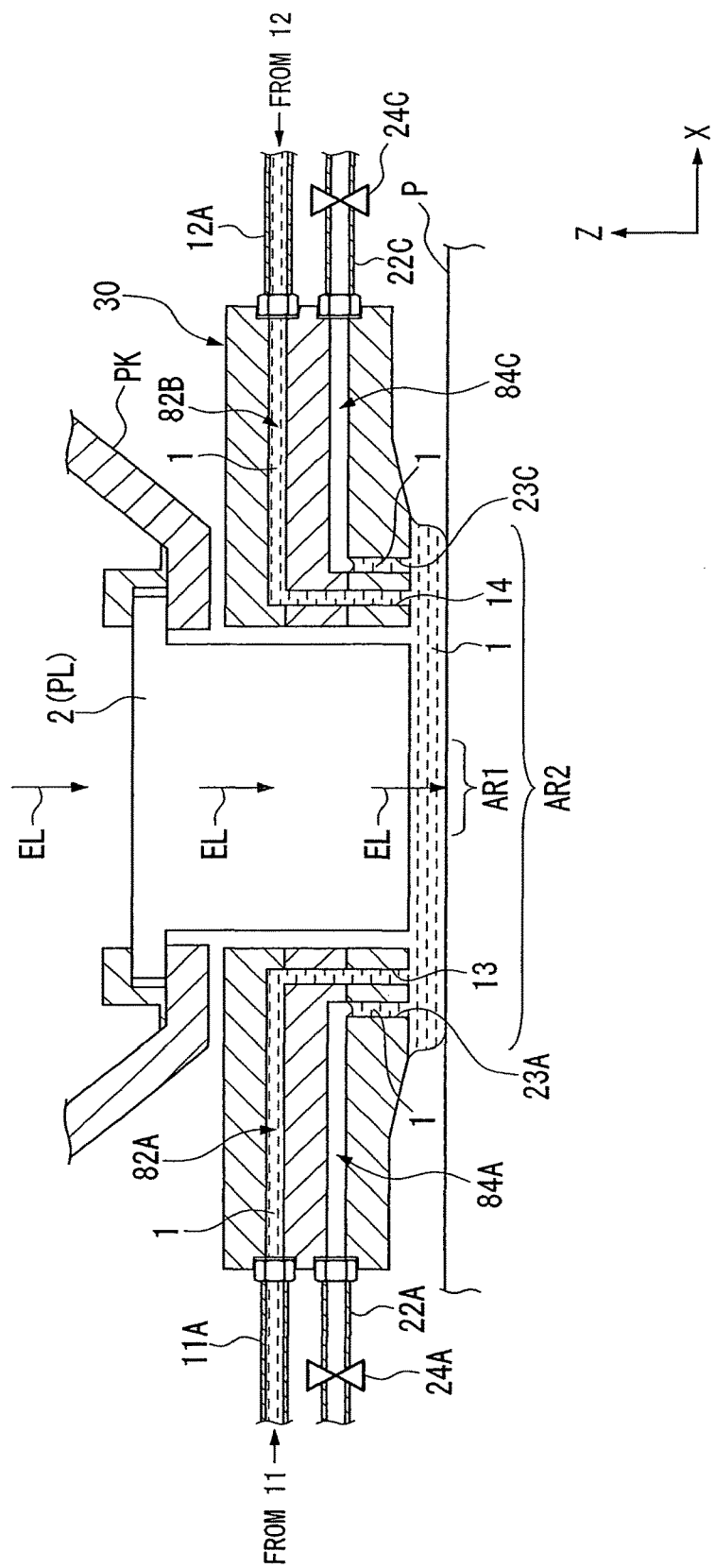
FIG. 10 is a schematic illustrating a liquid supply and recovery operation during exposure of a substrate.

FIG. 10 is a schematic showing an example of a state in which exposure operation is performed on substrate P. In FIG. 10, the exposure light EL having been irradiated from illumination optical system IL and having passed through mask M is irradiated on the image plane side of projection optical system PL, and, by doing so, the pattern of mask M is exposed on substrate P, via projection optical system PL and liquid 1 of liquid immersion region AR2. When exposure light EL is irradiated on the image plane side of projection optical system PL, i.e., during the exposure operation on substrate P, controller CONT performs the supply of liquid 1 onto substrate P by liquid supply mechanism 10. With the supply of liquid 1 by liquid supply mechanism 10 being continued during the exposure operation, liquid immersion region AR2 is formed well. On the other hand, when exposure light EL is irradiated on the image plane side of projection optical system PL, i.e., during the exposure operation on substrate P, controller CONT drives each of first to fourth bulbs 24A-24D to close the flow paths of first to fourth recovery pipes 22A-22D and thus does not perform the recovery of liquid 1 on substrate P by liquid recovery mechanism 20. With the recovery of liquid 1 by liquid recovery mechanism 20 being not performed during the exposure operation (when exposure light EL is irradiated on the image plane side of projection optical system PL), the exposure process can be performed in a state in which sound and vibration due to the recovery operation on liquid 1 are suppressed.

In particular, in the local liquid immersion system, as in the embodiment, in which liquid immersion region AR2 is formed on a part of substrate P, when the configuration in which liquid 1 on substrate P is sucked and recovered from above substrate P by using the vacuum system (vacuum pump) via recovery ports 23 of liquid recovery mechanism 20 is adopted, there arises the possibility that liquid recovery mechanism 20 recovers liquid 1 on substrate P together with gas surrounding the liquid. When liquid recovery mechanism 20 recovers liquid 1 via recovery ports 23, there occurs a situation in which liquid 1 flows intermittently into recovery flow paths 84 (84A-84D). Liquid 1 having flowed into recovery flow paths 84 is then divided to have a grain form (e.g., a water drop form), and liquid 1 collides with recovery flow paths 84 and/or recovery pipes 22 and generates sound and vibration. Thus, with the recovery of liquid 1 by liquid recovery mechanism 20 being not performed during the exposure operation (when exposure light EL is irradiated on the image plane side of projection optical system PL), the exposure process can be performed in a state in which sound and vibration due to the recovery operation on liquid recovery mechanism 20 are made not to be generated.

It should be noted that while, here, it is configured such that by driving bulbs 24 to close recovery pipes 22, the recovery of liquid 1 is not performed, it may also be configured such that, without using bulbs 24, by, for example, stopping the drive of the vacuum system (vacuum pump) constituting liquid recovery portion 21 during the exposure operation (when exposure light EL is irradiated on the image plane side of projection optical system PL), the recovery of liquid 1 is not performed.

In the embodiment, during the exposure operation, liquid supply mechanism 10 simultaneously performs the supply of liquid 1 onto substrate P from both sides of projection area AR1 from supply ports 13 and 14. By doing so, liquid 1 having been supplied from supply ports 13 and 14 onto substrate P then enters the space between the lower end surface of the end portion (optical element 2) of projection optical system PL and substrate P in a good condition that the liquid wets the surface and the substrate to extend to and fill the space, and thus the liquid forms liquid immersion region AR2 over an area at least larger than projection area AR1.

It is to be noted that in supplying liquid 1 onto substrate P from both scanning direction sides of projection area AR1, controller CONT may, by controlling the liquid supply operations of first and second liquid supply portions 11 and 12 of liquid supply mechanism 10, set, relative to the scanning direction, the per-unit-time liquid supply amount of the liquid supplied from the front side of projection area AR1 to be larger than the liquid supply amount of the liquid supplied from the side opposite thereto. For example, when substrate P is exposed while substrate P is moved in the +X-direction, controller CONT makes the liquid amount from the −X side relative to projection area AR1 (i.e., from supply port 13) larger than the liquid amount from the +X side (i.e., from supply port 14); on the other hand, when substrate P is exposed while substrate P is moved in the −X-direction, controller CONT makes the liquid amount from the +X side relative to projection area AR1 larger than the liquid amount from the −X side.

It is to be noted that it may also be configured such that with one supply port (e.g., supply port 13) being omitted or with one supply port (e.g., supply port 13) being not used, liquid 1 is continuously supplied from the other supply port 14.

Here, there is a possibility that with substrate P being moved, for example, in the +X-direction, the amount of the liquid moving, relative to projection area AR1, in the +X side increases, and a large amount of the liquid flows out to the outside of substrate P. However, because liquid 1 moving in the +X side will be captured by trapping surface 70 provide on the +X side under surface of flow path forming member 30, the disadvantage that the liquid flows out or scatters to, e.g., the surrounding area of substrate P can be suppressed.

During the exposure operation, the recovery operation on liquid 1 by liquid recovery mechanism 20 is not performed. After completion of the exposure, controller CONT drives bulbs 24, opens the flow paths of recovery pipes 22, and recovers liquid 1 on substrate P. Here, until the beginning of the recovery of liquid 1 by liquid recovery mechanism 20, a part of liquid 1 on substrate P is held by recovery ports 23 (23A-23D) of liquid recovery mechanism 20, as shown in FIG. 10. During this time, recovery ports (liquid holding portions) 23 hold liquid 1, utilizing the capillary phenomenon. A part of liquid 1 on substrate P moves upwards inside recovery ports 23 with the aid of the capillary phenomenon, and a predetermined amount thereof is held by the recovery ports 23. As just described, without performing the sucking and recovering operation by liquid recovery mechanism 20, a predetermined amount of liquid 1 can be held (recovered) with the aid of the capillary phenomenon, without vibration, etc. being generated. And, with the predetermined amount of liquid 1 being held by recovery ports 23, the amount of liquid 1 flowing out from substrate P to the outside thereof can be decreased during the exposure.

It should be noted that in order to hold liquid 1 well by recovery ports 23 utilizing the capillary phenomenon, at least the inner wall surfaces in the vicinity of recovery ports 23, of recovery flow paths 84, are preferably applied with lyophilic treatment (hydrophilic treatment). By doing so, recovery ports 23 (recovery flow paths 84) can hold liquid 1 well, utilizing the capillary phenomenon. Since liquid 1 of the embodiment is water having a large polarity, by forming a thin film with a substance with a molecular structure having a large polarity, e.g., alcohol, as hydrophilic (lyophilic) treatment applied to recovery ports 23, the inner wall surfaces of recovery flow paths 84, in the vicinity of recovery ports 23, can be given hydrophilicity, or by irradiating ultraviolet light thereto, hydrophilicity can be given.

It should also be noted that lyophilic treatment may be applied to surfaces, other than the surfaces in vicinity of recovery ports 23, of the flow paths of liquid supply mechanism 10 and liquid recovery mechanism 20.

In the embodiment, as shown in FIG. 3, a plurality of shot areas S1-S20 are set on substrate P, and the plurality of shot areas S1-S20 are sequentially exposed while substrate stage PST being moved. Du ring this process, the supply of liquid 1 from supply ports 13 and 14 is continuously performed. On the other hand, controller CONT recovers liquid 1 on substrate P by liquid recovery mechanism 20, in a partial period (at least a part in a stepping period) between completion of exposure of a given shot area and the beginning of exposure of the next shot area.

Figure 11:
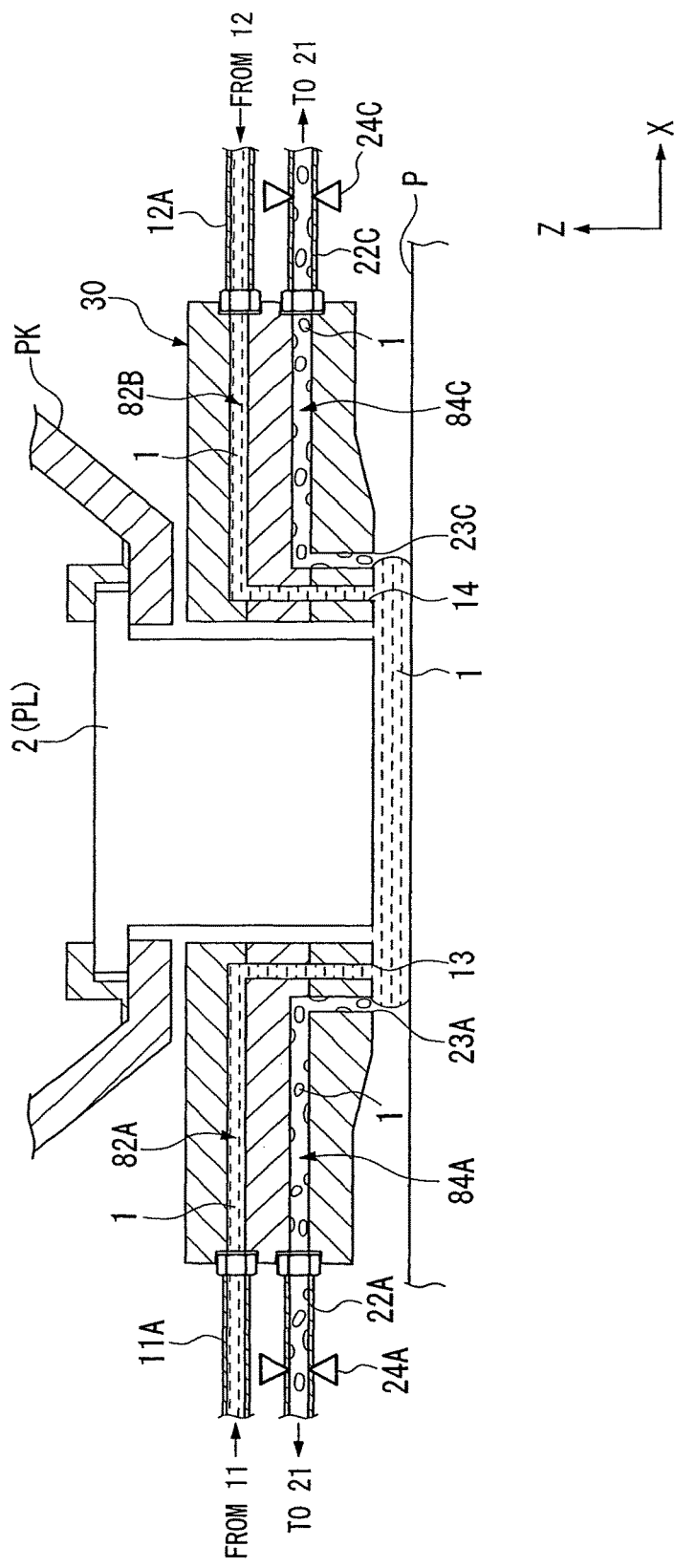
FIG. 11 is a schematic illustrating a liquid supply and recovery operation after completion of exposure of a substrate.

FIG. 11 is a schematic showing an example of a state in which liquid 1 on substrate P is being recovered by liquid recovery mechanism 20, in the period (the stepping period) between the end of exposure of a given shot area and the beginning of exposure of the next shot area.

In FIG. 11, exposure light EL is not irradiated on the image plane side of projection optical system PL, and controller CONT drives bulbs 24 to open the flow paths of recovery pipes 22. By doing so, liquid 1 on substrate P is sucked and recovered from recovery ports 23 disposed above substrate P. In this case, because liquid 1 on substrate P is recovered together with gas surrounding the liquid, the liquid flows intermittently into recovery flow paths 84. Liquid 1 having flowed into recovery flow paths 84 is then, as shown in FIG. 11, divided to have a grain form (e.g., a water drop form), and this liquid 1 collides with recovery flow paths 84 and/or recovery pipes 22 and generates sound and vibration. However, because, during this process, exposure light EL is not irradiated on the image plane side of projection optical system PL, i.e., the pattern of mask M is not exposed onto substrate P, the sound and vibration generated do not affect the exposure accuracy. It is to be noted that while the liquid recovery time and amount during the stepping period are preferably set such that the liquid irradiated with the exposure light during the exposure of the immediately preceding shot area is recovered as much as possible, all of the liquid is not required to be recovered. In addition, the liquid recovery time and amount are preferably set such that the optical path space on the image plane side of optical element 2 is filled with liquid 1.

Controller CONT continues the supply of liquid 1 by liquid supply mechanism 10 in a period that includes the recovery operation period of liquid 1 on substrate P by liquid recovery mechanism 20, between the end of exposure of a given shot area and the beginning of exposure of the next shot area. By doing so, occurrence of the vibration of liquid 1 (the so-called water hammer phenomenon) that occurs, with the repletion of the supply and supply halt of liquid 1, between projection optical system PL and substrate P can be prevented. If the water hammer phenomenon occurs, it deteriorates the pattern image because of the vibrating liquid 1 and also induces a throughput decrease, requiring, for example, to set a waiting time until the vibration of liquid 1 settles. However, with the supply of liquid 1 being continued also during the above-described period, in which exposure light EL is not irradiated, the space between optical element 2 and substrate P can be sufficiently filled with liquid 1 also at the beginning of the exposure of the next shot area, and thus the disadvantages such as the exposure accuracy decrease and the throughput decrease can be suppressed. It is to be noted that the liquid supply amounts from supply ports 13 and 14 of liquid supply mechanism 10 during the stepping period may not be the same as in the exposure operation period, and, for example, the liquid supply amounts during the stepping period may be made smaller than the liquid supply amounts during the exposure operation period.

Here, controller CONT performs the recovery of liquid 1 by liquid recovery mechanism 20 after each completion of exposure of a predetermined number of shot areas. For example, controller CONT performs the recovery of liquid 1 in the periods after each completion of exposure of four shot areas among the plurality of shot areas S1-S20. In this case, the recovery of liquid 1 is performed after each completion of exposure of the shot areas S4, S8, S12, S16, and S20. Specifically, the recovery of liquid 1 is performed in a period between the end of exposure of shot area S4 (S8, S12, S16, S20) and the beginning of exposure of the next shot area S5 (S9, S13, S17). Of course, the predetermined number is not limited to "4," but may be "1," i.e., the recovery of liquid 1 may be performed for each one shot area. Alternatively, controller CONT may perform the recovery after completion of exposure of a predetermined shot area. For example, by prescribing that the recovery of liquid 1 is performed in a period after completion of exposure of the tenth shot area S10, controller CONT performs the recovery of liquid 1 in at least a partial period between the end of exposure of shot area S10 and the beginning of exposure of the next shot area S11. By doing so, the disadvantage that liquid 1 flows out to the outside of substrate P can be prevented.

Further, controller CONT performs the recovery of liquid 1 by liquid recovery mechanism 20 after completion of exposure of a given shot area and during the stepping movement of substrate P for exposure of the next shot area. In the example shown in FIG. 3, controller CONT performs the recovery of liquid 1 after completion of exposure of shot area S2 (S6, S10, S14, S18) and during the stepping movement of substrate P for exposure of the next shot area S3 (S7, S 11, S15, S19). During the stepping movement period, the pattern of mask M is not exposed onto substrate P, and thus, with the recovery of liquid 1 being performed in this period, the influence on the exposure accuracy exerted by the vibration caused by the recovery of liquid 1 can be suppressed.

After completion of the exposure processes on all of the shot areas S1-S20, i.e., after completion of exposure of a piece of substrate P, controller CONT performs sucking and recovering of liquid 1 remaining on substrate P and substrate stage PST. Be cause, in the embodiment, there is a possibility that liquid 1 remains, albeit only slightly, on substrate P and substrate stage PST, controller CONT drives, after completion of exposure of a piece of substrate P, the vacuum system of liquid recovery mechanism 20 to suck and recover liquid 1 on substrate P and substrate stage PST, via recovery ports 23 of liquid recovery mechanism 20. In the case of recovering liquid 1 on substrate P after completion of exposure of a piece of substrate P, controller CONT relatively moves recovery ports 23 of liquid recovery mechanism 20 that are disposed above substrate stage PST and substrate stage (substrate holding member) PST that is movable while holding substrate P, to recover liquid 1 on substrate P or substrate stage PST.

Figure 12:
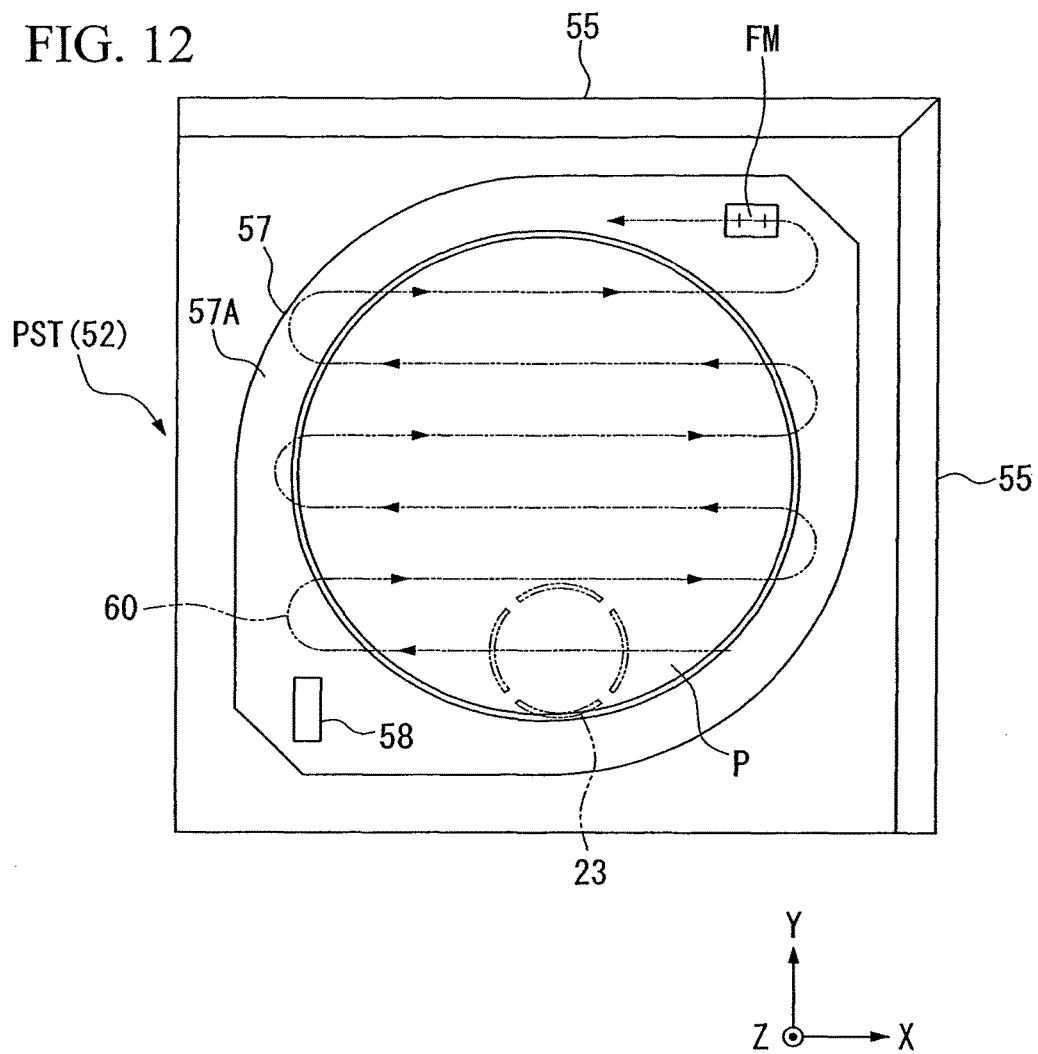
FIG. 12 is a schematic illustrating an example of a liquid recovery operation after completion of exposure of a substrate.

FIG. 12 is a schematic illustrating an example of a manner in which after completion of exposure of a piece of substrate P, substrate stage PST holding substrate P moves, relative to recovery ports 23 of liquid recovery mechanism 20, in the XY-plane.

Controller CONT moves XY stage 53 such that recovery ports 23 of liquid recovery mechanism 20 proceed along the broken line arrow 60 of FIG. 12. Through the translational movement along the XY-plane of substrate stage PST, recovery ports 23 scan substrate P and substantially the entire upper surface of substrate stage PST; by doing so, liquid 1 remaining on substrate P and substrate stage PST is reliably recovered by liquid recovery mechanism 20 via recovery ports 23.

Figure 13:
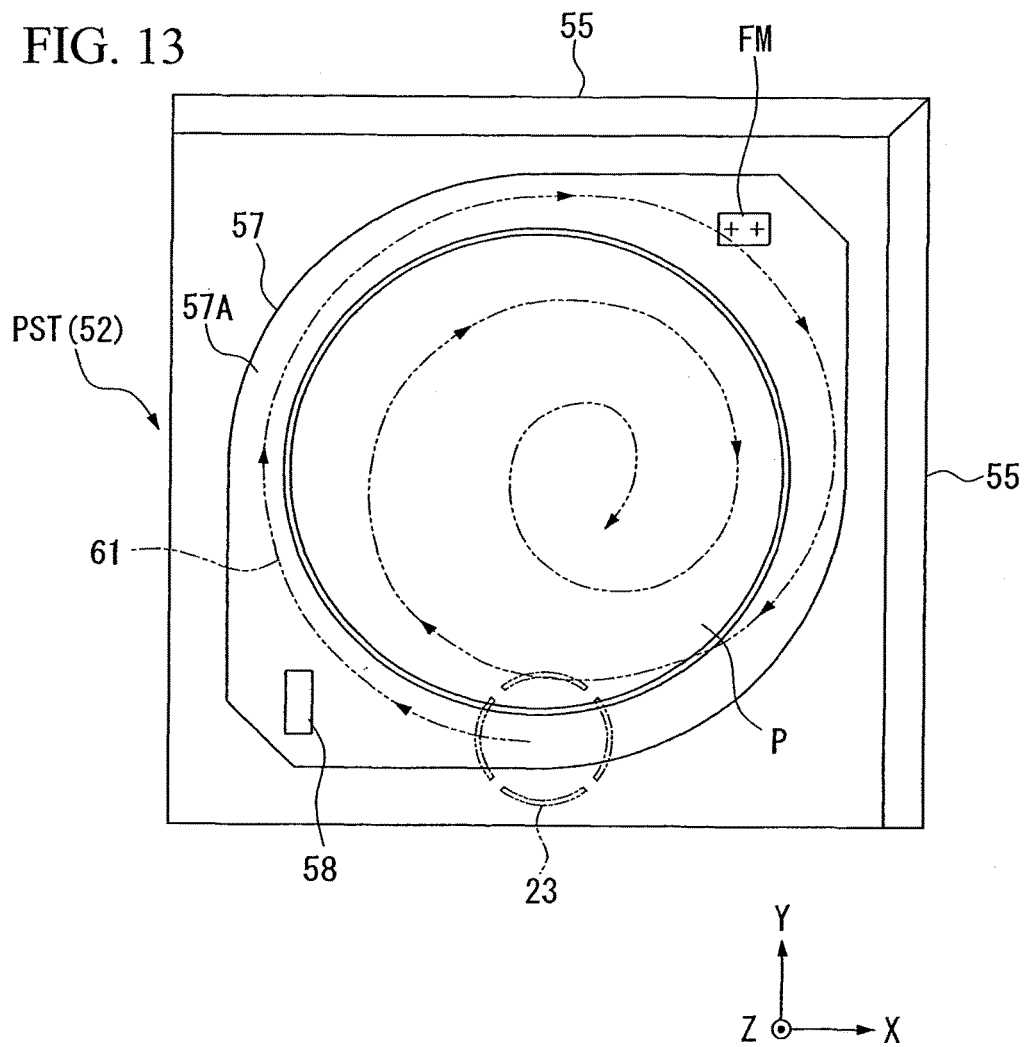
FIG. 13 is a schematic illustrating another example of a liquid recovery operation after completion of exposure of a substrate.

It should be noted that while, in the illustration shown in FIG. 12, substrate P and substrate stage PST follow a movement trajectory in which the X-direction scanning movements and the Y-direction stepping movements, relative to recovery ports 23, are repeated, the movement trajectory may be discretionally set, i.e., they may, for example, move following the spiral-shaped movement trajectory, as indicated by the dashed line arrow 61 of FIG. 13, in which a circle-like track, starting from the outside of substrate P and gradually proceeding to the inside thereof (or, from the inside to the outside), is set, or may move following a concentric circle-like track in which multiple circles are set.

It should be noted that it may also be configured such that by providing a movement mechanism to flow path forming member 30 having recovery ports 23, liquid 1 is recovered while moving recovery ports 23 in the XY-direction relative to substrate P and substrate stage PST holding the substrate P, or such that recovery ports 23 and substrate stage PST are both moved.

Further, it may also be configured such that when recovering the liquid on substrate P as described above, the distance between the end of projection optical system PL (optical element 2) and the surface of substrate P, i.e., the distance between recovery ports 23 and the surface of substrate P, is made smaller than during the exposure. By doing so, the efficiency of recovering the liquid from substrate P can be increased, and the liquid on substrate P can be reliably recovered. This method works effectively, particularly when recovering the liquid from substrate P after completion of exposure of a piece of substrate P.

Figure 14:
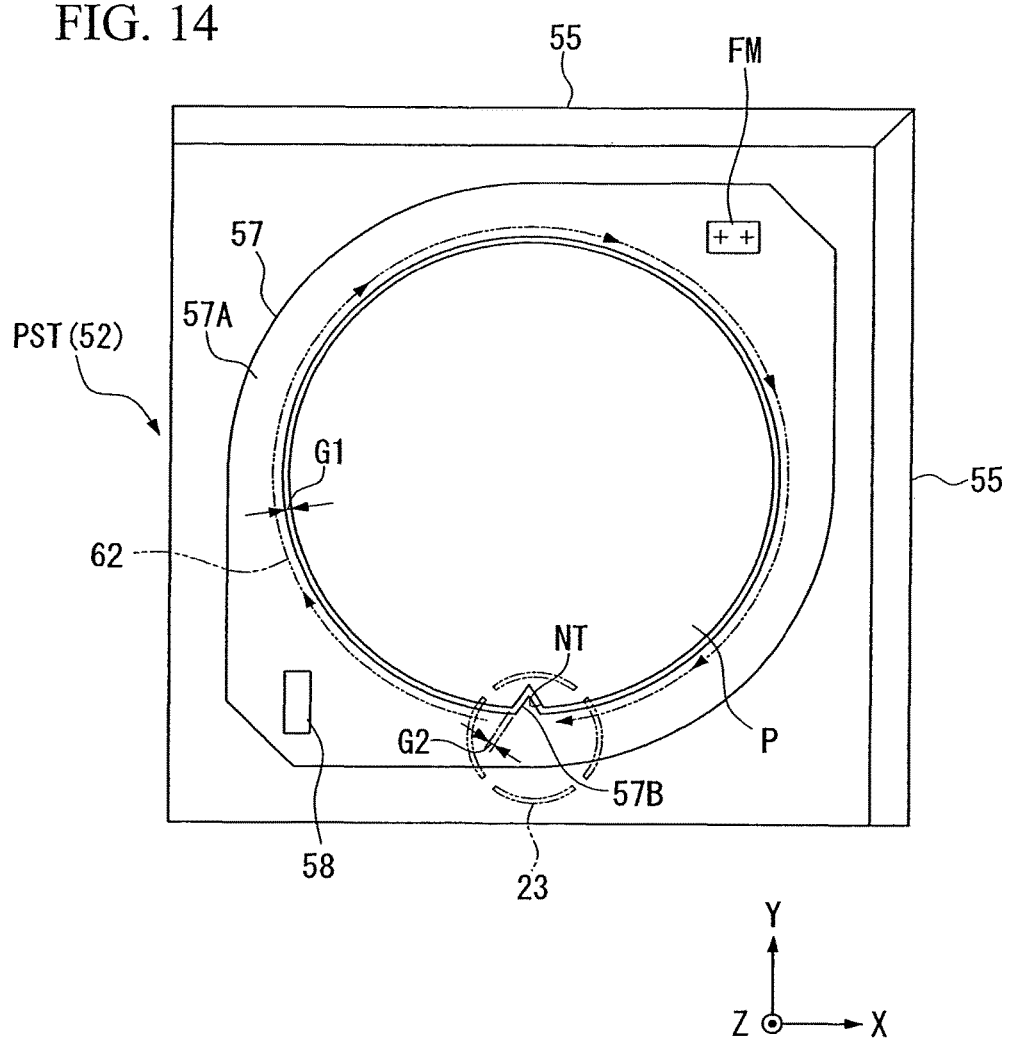
FIG. 14 is a schematic illustrating still another example of a liquid recovery operation after completion of exposure of a substrate.

Further, it may also be configured such that while moving substrate stage PST such that, as indicated by the broken line arrow 62 of FIG. 14, recovery ports 23 follow, over substrate stage PST, the movement trajectory located along gap G1 between the edge of substrate P and flat surface 57A of plate portion 57, the recovery operation (sucking operation) is performed, using recovery ports 23. By doing so, not only the liquid remaining on substrate P or plate portion 57 but also liquid 1 having penetrated into gap G1 can be recovered well. Thus, the disadvantage that liquid 1 penetrates, via gap G1, into the inside of substrate stage PST, and thus lusting and electric leakage occur inside substrate stage PST can be prevented. Further, when the recovery operation on gap G1 is performed, the moving speed of substrate stage PST may be made smaller than that when the recovery operation on the surface of substrate P and the upper surface of substrate stage PST is performed, or the recovery of the liquid in the vicinity of gap G1 may be performed while repeating the movements and halts of substrate stage PST. Further, when the recovery operation on the vicinity of gap G1 is performed, the recovery operation may also be performed, with substrate stage PST being raised in the +Z-direction to make the distance between recovery ports 23 and substrate stage PST (substrate P) smaller than during the liquid immersion exposure of substrate P, i.e., in a state that substrate stage PST is located nearer to recovery ports 23. Of course, also when the recovery operation on the surface of substrate P and the upper surface of substrate stage PST (e.g., flat surface 57A of plate portion 57) is performed, substrate P or substrate stage PST may be located nearer to recovery ports 23, similarly to the above-described manner. Still further, it may also be configured such that a Z drive mechanism is provided to flow path forming member 30 having recovery ports 23, and when recovery ports 23 and substrate stage PST are made located nearer to each other to perform the liquid recovery after exposure of substrate P, flow path forming member 30 is moved in the −Z-direction to be located nearer to substrate stage PST, or flow path forming member 30 and substrate stage PST are both moved.

It is to be noted that the relative movement between recovery ports 23 of liquid recovery mechanism 20 and substrate stage PST to recover the liquid remaining the surface of substrate P and the upper surface of substrate stage PST is preferably initiated after almost all of liquid 1 that filled the optical path space on the image plane side of optical element 2 of projection optical system PL is recovered from recovery ports 23.

Further, in the case of a configuration in which, as shown in FIG. 14, notch portion NT, a cut portion, is formed on substrate P, it may be configured such that after completion of liquid immersion exposure of substrate P, controller CONT places recovery ports 23 of liquid recovery mechanism 20 so as to face notch portion NT of substrate P and intensively performs the liquid recovery operation (sucking operation). Here, in FIG. 14, protrusion portion 57B corresponding to the shape of notch portion NT is formed on the internal surface of plate portion 57, and a predetermined gap G2 is formed between notch portion NT and the side surface of protrusion portion 57B. The re is a high possibility that liquid 1 penetrates into gap G2 between notch portion NT and plate portion 57; however, with the recovery operation on the vicinity of notch portion NT being intensively performed, the disadvantage that liquid 1 penetrates into gap G2 can be prevented, and even if liquid 1 penetrates, liquid 1 can be recovered well. Thus, the disadvantage that liquid 1 penetrates, via gap G2, into the inside of substrate stage PST, and thus lusting and electric leakage occur inside substrate stage PST can be prevented. Further, when performing the recovery operation on the vicinity of notch portion NT using recovery ports 23, the recovery operation may be performed in a state that substrate stage PST is halted relative to recovery ports 23, in other words, in a state that the relative position between recovery ports 23 and notch portion NT is maintained. By doing so, the liquid recovery can be performed satisfactorily. Alternatively, when performing the recovery operation on the vicinity of notch portion NT, the moving speed of substrate stage PST may be made to be a lower speed compared with when the recovery operation on the above-described gap G1 is performed and/or when the recovery operation on the surface of substrate P and the upper surface of substrate stage PST is performed.

It should be noted that the above-described liquid recovery operations on gap G1 and gap G2 may be executed in combination with the liquid recovery operations shown in FIGS. 12 and 13.

In addition, the description has been made referring to, as a cut portion, notch portion NT by way of example, but even in the case of a configuration in which an orientation flat portion is formed on substrate P, the liquid recovery can be performed well, by intensively performing the recovery operation on the vicinity of the orientation flat portion.

As described above, by not performing the recovery of liquid 1 by liquid recovery mechanism 20 when exposure light EL is irradiated on the image plane side of projection optical system PL, e.g., during the exposure operation on substrate P, sound and vibration due to the recovery operation on liquid 1 can be made not to be generated during the exposure operation on substrate P. Thus, the disadvantage that the exposure accuracy decreases due to the sound and vibration can be prevented.

Further, in the embodiment, by moving substrate stage PST holding substrate P relative to recovery ports 23 of liquid recovery mechanism 20 in the XY-direction after completion of exposure on substrate P, liquid 1 that not been recovered and has remained on substrate P and substrate stage PST and the liquid in gap G1 and gap G2 on the edge of substrate P can be recovered. Accordingly, the occurrence of the disadvantages, such as the occurrence of a water mark, rusting of the apparatus, and the variation of the ambience that are due to liquid 1 remained, can be prevented.

It should be noted that while, in the embodiment, controller CONT closes, by using bulbs 24A-24D, all of the flow paths of the plurality of recovery pipes 22A-22D when exposure light EL is irradiated on the image plane side of projection optical system PL, it may also be configured such that with only the flow paths of a part of the recovery pipes, e.g., recovery pipes 22B and 22D that connect to recovery ports 23B and 23D located on either side of the projection area AR1 in the non-scanning direction are being closed and with the flow paths of the other recovery pipes 23A and 23C being opened, the recovery operation on liquid 1 is performed through recovery ports 23A and 23C during the exposure operation. By doing so, because the vibration generating positions decreases, the influence exerted on the exposure accuracy can be reduced. Alternatively, it may also be configured, for example, such that to each of recovery ports 23A-23D (recovery pipes 22A-22D) is connected one of separate liquid recovery portions, independent of each other, and among the plurality of liquid recovery portions (vacuum system), a part of the liquid recovery portions is driven, with the other liquid recovery portions being not driven.

Further, in the above-described embodiment, the scanning speed of substrate P (substrate stage PST) when such shot areas (e.g., S3, S6, S15, S18) that the boundary between the edge of substrate P and plate portion 57 is included in liquid immersion region AR2 during exposure or before/after the exposure are exposed may be set to be lower than the scanning speed of substrate P when the shot areas (e.g., S9) located near to the center of substrate P are exposed. By doing so, even if there is a slight height difference between flat surface 57A of plate portion 57 and the surface of substrate P, the pressure change of liquid 1 between projection optical system PL and substrate P can be suppressed, and thus the variation of projection optical system PL (lens 2) and the variation of substrate stage PST that are caused by the pressure change can be prevented. Flowing out and scattering of liquid 1 can also be suppressed. Further, without being limited to the exposure period, when the boundary between the edge of substrate P and plate portion 57 is located within liquid immersion region AR2, the moving speed of substrate stage PST may set to be lower.

By the way, the above-described embodiment has been described through the example case where with exposure light EL being irradiated on the image plane side of projection optical system PL, the pattern of mask M is exposed onto substrate P, but the present invention can also be applied, for example, during the operation of detecting exposure light EL in which the exposure light is detected by light sensor portion 58 positioned on substrate stage PST on the image plane side of projection optical system PL, via projection optical system PL and liquid 1 held beneath projection optical system PL. That is, controller CONT does not perform the recovery of liquid 1 by liquid recovery mechanism 20 when exposure light EL is irradiated on light sensor portion 58 on substrate stage PST, via projection optical system PL and liquid 1. By doing so, because sound and vibration due to the recovery of liquid 1 do not occur during the operation of detecting exposure light EL, the disadvantage that the detection accuracy decreases due to the sound and vibration can be prevented.

In detecting exposure light EL by using light sensor portion 58, controller CONT, before (or after) the exposure process on substrate P, moves substrate stage PST to make projection optical system PL and light sensor portion 58 face each other and then supplies liquid 1, from liquid supply mechanism 10, between projection optical system PL and light sensor portion 58. And, after the space between projection optical system PL and light sensor portion 58 is filled with liquid 1 and thus liquid immersion region AR2 is formed, controller CONT emits exposure light EL from illumination optical system IL and irradiates the exposure light onto light sensor portion 58, via projection optical system PL and liquid 1. At this time, the recovery of liquid 1 by liquid recovery mechanism 20 is not performed. Detection results of light sensor portion 58 are outputted to controller CONT, and controller CONT, based on the detection results, performs such adjustment processes that exposure light EL can be irradiated on the image plane side of projection optical system PL in a desired state, for example, the imaging characteristics adjustment and/or illuminance adjustment of projection optical system PL or the temperature adjustment of liquid 1. After completion of the detection operation by light sensor portion 58, controller CONT performs the recovery of liquid 1 by liquid recovery mechanism 20. After completion of the above-mentioned adjustment processes and recovery of liquid 1, controller CONT initiates the exposure operation for substrate P. It is to be noted that also in the liquid recovery operation performed after exposure light EL has been irradiated on light sensor portion 58, controller CONT can perform the exposure process, after, as has been described referring to FIG. 12, etc, by moving substrate stage PST (light sensor portion 58) relative to recovery ports 23 of liquid recovery mechanism 20, sufficiently performing the recovery of liquid 1 remaining on substrate stage PST.

It is to be noted that while, in each of the above-described embodiments, it is configured such that the recovery of liquid 1 is not performed when exposure light EL emitted from illumination optical system IL is being irradiated on the image plane side of projection optical system PL, the light irradiated on the image side is not limited to exposure light EL emitted from illumination optical system IL. For example, when, to align mask M and substrate P with a predetermined position, fiducial mark FM provided on substrate stage PST is detected, by using mask alignment system 90, through TTM (TTR) type system, alignment light other than exposure light EL emitted from illumination optical system IL is emitted from mask alignment system 90 positioned over mask M. The alignment light is irradiated onto fiducial mark FM via alignment marks formed on mask M and projection optical system PL. In this regard, a configuration in which, in a state that the space between projection optical system PL and a fiducial mark member that has fiducial mark FM and located on substrate stage PST is filled with liquid 1, the above-mentioned alignment light is irradiated onto fiducial mark FM and is then detected can be conceived; but, also in this case, by not performing the recovery of liquid 1 by liquid recovery mechanism 20 during the detection operation on fiducial mark FM, i.e., when the alignment is irradiated on the image plane side of projection optical system PL, the detection operation on fiducial mark FM can be performed in a state that sound and vibration are suppressed.

Further, in the above-described embodiment, it is configured such that after completion of exposure of a piece of substrate P, with substrate P and substantially the entire upper surface of substrate stage PST being scanned by recovery ports 23, the remaining liquid is recovered. However, in the case where there remains no liquid (or remains only a slight amount thereof) on substrate P and/or on the upper surface of substrate stage PST, the entire scanning by recovery ports 23 for substrate P and the upper surface of substrate stage PST may be omitted. It may also be configured such that the scanning by recovery ports 23 after completion of exposure is performed only for the entire surface of substrate P, and the scanning for the upper surface of substrate stage PST is omitted.

It should be noted that while, in the embodiment, both of the recovery operations during the stepping periods and the recovery operation for the liquid remaining on the upper surface of substrate P (substrate stage PST) by recovery ports 23 are executed, it may also be configured such that either one of the operations is omitted.

Next, another embodiment of an exposure apparatus of the present invention will be described referring to FIG. 15. In the following description, the same or equivalent constituent elements as those in the above-described embodiment are denoted by the same reference numerals, and their descriptions will be abridged or omitted.

In the present embodiment, the sucking and recovering operation, by liquid recovery mechanism 20, for liquid 1 on substrate P is performed also during exposure of substrate P. And, the embodiment features in that during exposure of substrate P, the per-unit-time liquid supply amount of the liquid supplied on substrate P by liquid supply mechanism 10 is made larger than the per-unit-time liquid recovery amount of the liquid recovered from substrate P by liquid recovery mechanism 20.

Figure 15:
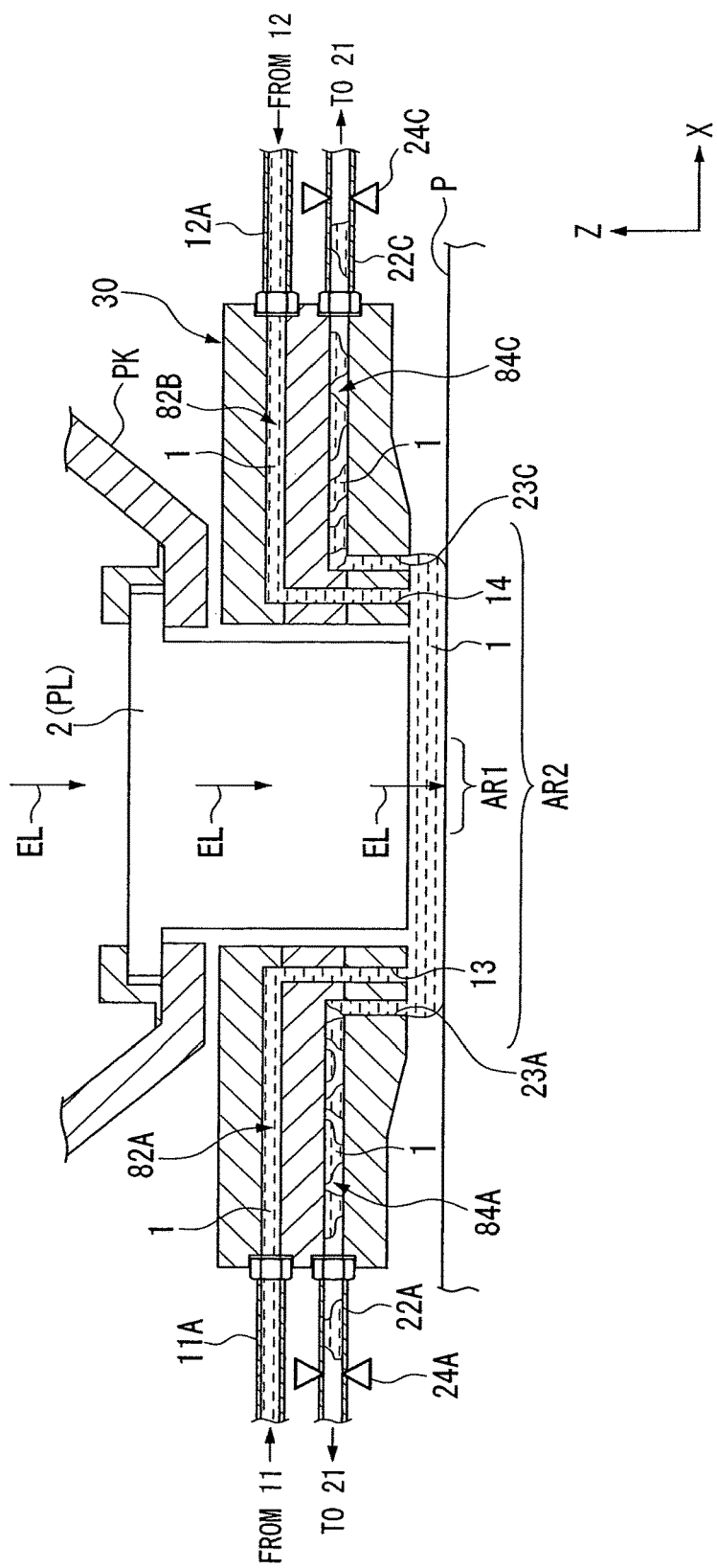
FIG. 15 is a schematic showing another embodiment of an exposure apparatus of the present invention.

As shown in FIG. 15, during exposure of substrate P, controller CONT supplies onto liquid 1 from supply ports 13 and 14 of liquid supply mechanism 10 and, at the same time, sucks and recovers liquid 1 on substrate P by recovery ports 23 of liquid recovery mechanism 20, to form liquid immersion region AR2 of liquid 1 between projection optical system PL and substrate P. Du ring this process, controller CONT, during exposure of substrate P, makes the per-unit-time liquid supply amount of the liquid supplied on substrate P by liquid supply mechanism 10 is made larger than the per-unit-time liquid recovery amount of the liquid recovered by liquid recovery mechanism 20.

By doing so, even if when liquid recovery mechanism 20 sucks and recovers, from above substrate P, liquid 1 on the substrate P, the recovery mechanism recovers the liquid together with gas surrounding the liquid, and sound and vibration occur therethrough, such sound and/or vibration can be reduced. More specifically, as described above, the reason that sound and vibration occur lies in that because of the liquid 1 flows intermittently into recovery flow paths 84 via recovery ports 23; with the liquid intermittently flowing into the recovery flow paths, liquid 1 is divided into grains; and, with the divided liquid 1 colliding with recovery flow paths 84 and/or recovery pipes 22, such sound and/or vibration occur. To address this problem, by making the liquid supply amount during exposure of the liquid supplied onto substrate P larger than the recovery amount to fill in recovery ports 23A-23D with liquid 1 as much as possible, the proportion of liquid 1 when liquid recovery mechanism 20 recovers liquid 1 together with the gas is made larger.

By doing so, the amount of the liquid becomes smaller, liquid 1 can be made to flow, via recovery ports 23, into recovery flow paths 84 substantially continuously, liquid 1 flowing into the recovery flow paths from recovery ports 23 becomes difficult to be divided, and thus the sound and/or vibration can be reduced.

It is to be noted that, in the embodiment also, it may also be configured such that with one supply port (e.g., supply port 13) being omitted or with one supply port (e.g., supply port 13) being not used, liquid 1 is continuously supplied from the other supply port 14.

Further, it may also be configured such that, as has been described referring to FIGS. 12 and 13, controller CONT, after completion of exposure of substrate P, moves, relative to recovery ports 23 of liquid recovery mechanism 20, substrate stage PST holding substrate P, to recover liquid 1 on substrate P or substrate stage PST.

Further, as shown in FIG. 14, it may also be configured such that the liquid in gaps G1 and G2 located on the edge of substrate P is recovered. Because, in the embodiment, the liquid supply amount of the liquid supplied by liquid supply mechanism 10 is made larger than the liquid recovery amount of the liquid recovered by liquid recovery mechanism 20, there is a possibility that liquid 1 that has not been recovered remains on substrate P and/or on substrate stage PST. Thus, after completion of exposure of substrate P, by moving, relative to recovery ports 23, substrate P and substrate stage PST holding the substrate P in the XY-direction to recover liquid 1, occurrence of the disadvantage that liquid 1 remains on substrate P and/or substrate stage PST can be prevented.

It is to be noted that while, in each of the embodiments described referring to FIGS. 1 to 15, it is configured such that supply ports 13 and 14 of liquid supply mechanism 10 are each provided on either one of the both sides of projection area AR1 in the scanning direction (the X-axis direction), it may also be configured such that by also providing separate supply ports on either one of the both sides in the non-scanning direction (the Y-axis direction), the liquid supply is performed by combining those multiple supply ports. Alternatively, the supply port may be provided as annular one so as to surround the entire circumference of projection area AR1.

It is to be noted that while, in the above-described embodiment, it is configured such that trapping surfaces 70 are each provided on either one of the both sides of projection area AR1 only in the scanning direction, it may also be configured such that the trapping surfaces are provided on the sides of projection area AR1 in the non-scanning direction. On the other hand, it is in the scanning direction that liquid 1 is apt to flow out, and thus, even if it is configured such that trapping surfaces 70 are provided only in the scanning direction, liquid 1 that is going to flow out can be captured well. In addition, trapping surface 70 is not required to be a flat surface; for example, the surface may be constituted by combining a plurality of flat surfaces. Alternatively, trapping surface 70 may be a curved surface and may be applied with surface area enlarging treatment, specifically, surface roughening treatment.

It is to be noted that while, in the above-described embodiment, flow path forming member 30 is formed by using three members, the number of members is not limited to "three." Further, while, in the above-described embodiment, members 31-33 that form flow path forming member 30 are each a quadrangular, plate-shaped member, they may be circular, plate-shaped members or may be elliptical, plate-shaped members, elongated in the X-direction. Still further, the flow paths communicating with supply ports 13 and 14 and the flow paths communicating with recovery ports 23A, 23B, 23C, and 23D may be formed in separate members, and the flow path for each port may be formed in each of separate members.

Figure 16:
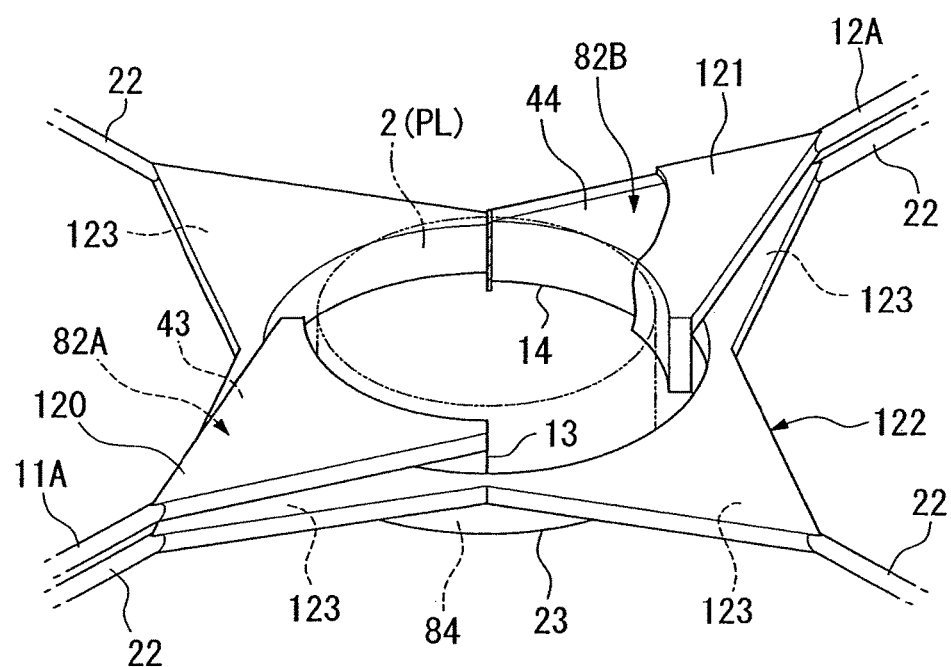
FIG. 16 is an outline perspective view showing another example of a flow path forming member.

It is to be noted that while, in the embodiment, supply flow paths 82 and recovery flow paths 84 are provided integrally inside flow path forming member 30, supply flow paths 82 and recovery flow paths 84 may be formed by members different from each other, as shown in FIG. 16. In FIG. 16, on the −X side of projection optical system PL (optical element 2) is provided first supply member 120 that forms supply flow path 82A, and on the +X side is provided second supply member 121 that forms supply flow path 82B. First supply member 120 and second supply member 121 have taper-shaped groove portion 43 and taper-shaped groove portion 44, respectively, and supply liquid 1 onto substrate P from supply port 13 and supply port 14 of arc shape when viewed from the top, respectively. Further, recovery member 122 that forms recovery flow path 84 is provided so as to surround optical element 2 of projection optical system PL and first and second supply members 120 and 121. In this embodiment, recovery port 23 that connects to recovery flow path 84 is formed to be ring-shaped such that the recovery port surrounds projection area AR1 of projection optical system PL and the circumference of supply ports 13 and 14. And, to the recovery port 23 are connected a plurality of (four) taper-shaped flow paths 123 and recovery pipes 22.

Figure 17A:
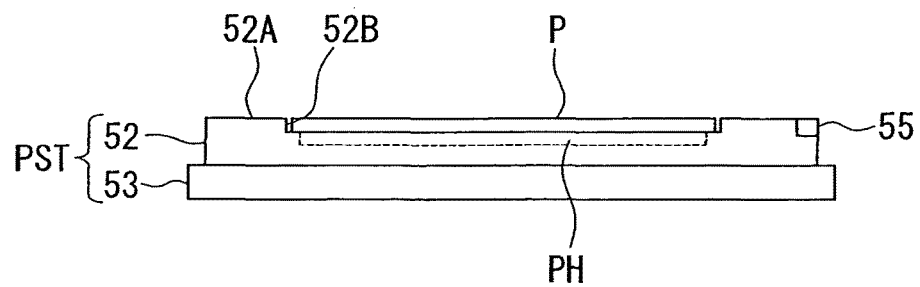
FIGS. 17A and 17B are drawings showing another example of a substrate stage related to the present invention.
Figure 17B:
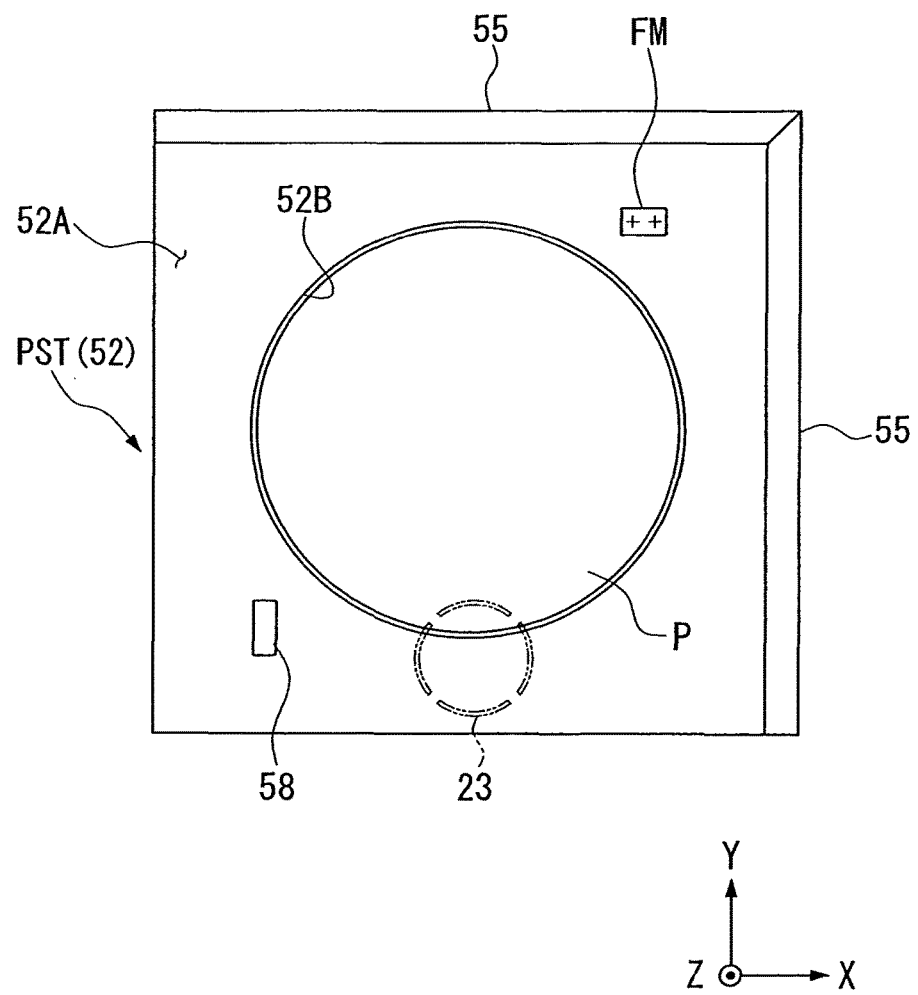

It should be noted that while, in the above-described embodiment, it is configured such that substrate stage PST is provided with the annular plate portion 57 provided so as to surround substrate P, it may also be configured such that, as shown in FIGS. 17A and 17B, the upper surface of substrate stage PST is set so that the upper surface constitutes the same plane as the surface of substrate P supported by the substrate stage PST. Here, FIG. 17A is a side view of substrate stage PST; FIG. 17B is a plan view. In FIGS. 17A and 17B, on substrate stage PST is provided concave portion 52B; inside concave portion 52B is provided substrate holder PH that holds substrate P. And, upper surface 52A of substrate stage PST, other than concave portion 52B, is a flat surface of which height is substantially equal to (which shares the same plane as) the surface of substrate P held by substrate holder PH. Further, the upper surfaces of moving mirrors 55 also have substantially the same height (share the same plane) as upper surface 52A of substrate stage PST.

After completion of liquid immersion exposure process on substrate P on substrate stage PST shown in FIGS. 17A and 17B, controller CONT stops the liquid supply by liquid supply mechanism 10. On the other hand, after completion of liquid immersion exposure process on substrate P, controller CONT recovers, while oscillating (moving with small stroke lengths) substrate stage PST, liquid 1 on substrate P by liquid recovery mechanism 20. By performing, while oscillating substrate stage PST, the recovery operation, liquid 1 on substrate P can be recovered better than when not doing so.

Further, after recovering, while oscillating substrate stage PST, liquid 1 on substrate P, controller CONT moves, relative to recovery ports 23 of liquid recovery mechanism 20, substrate stage PST along a predetermined movement trajectory (see FIGS. 12 and 13), to scan recovery ports 23 over the entire surface of substrate P. After, in this way, performing the liquid recovery operation on the entire surface of substrate P, controller CONT carries out (unloads) substrate P from substrate stage PST. Next, substrate P to be exposed is carried in (loaded) on substrate stage PST. After performing liquid immersion exposure on this substrate P, controller CONT performs the liquid recovery operation on the entire surface of substrate P and then unloads the substrate P, in the same manner as described above.

In the embodiment, the liquid recovery operation on the entire surface of substrate P performed by liquid recovery mechanism 20 after completion of liquid immersion exposure of substrate P is performed on each of (on a substrate P basis) the substrates P that have been sequentially mounted on substrate stage PST and exposed. If liquid 1 remains on substrate P having been liquid immersion exposed, there arises a disadvantage that a water mark is formed on substrate P, or liquid 1 drops (scatters) from substrate P on the conveyance path of the unloaded substrate P. However, in the embodiment, by performing, on a substrate P basis, the liquid recovery operation on the entire surface of the substrate P, the disadvantage due to liquid 1 remaining on substrate P having been liquid immersion exposed can be prevented.

In addition, controller CONT performs liquid recovery operations on the entire area of upper surface 52A of substrate stage PST, in addition to the entire surface of substrate P, on a predetermined number of processed substrates basis (or on a predetermined time interval basis). For example, controller CONT performs liquid recovery operations on the entire surface of substrate P and the entire upper surface of substrate stage PST on a lot of substrates P basis. To perform the liquid recovery operation on the entire surface of substrate P and the entire upper surface of substrate stage PST, it is only required to, as described referring to FIGS. 12 and 13, move substrate stage PST, relative to recovery ports 23 of liquid recovery mechanism 20, along a predetermined movement trajectory. The probability that liquid 1 remains on upper surface 52A of substrate stage PST after the liquid immersion exposure is low; even in the case where liquid 1 is remaining on upper surface 52A, if the remaining amount very small, the influence thereof exerted on the exposure process of the substrate P to be loaded next is small. Thus, with the liquid recovery operations on upper surface 52A of substrate stage PST being performed, for example, on a lot of substrates P basis, the liquid recovery operation time can be shortened, and thus the throughput can be improved. Further, the liquid recovery operation as shown in FIG. 14 may be additionally used.

It is to be noted that it may also be configured such that the recovery operations are performed on the entire upper surface of substrate stage PST, in addition to the entire surface of substrate P, on a lot of substrates P basis. Of course, it may also be configured such that the liquid recovery operations are performed on the entire area of upper surface 52A of substrate stage PST, in addition to the entire surface of substrate P, on a substrate P basis. Further, it may also be configured such that after fiducial mark FM on substrate stage PST and/or light sensor portion 58 has been used in a liquid immersion state, a liquid recovery operation on only the upper surface of substrate stage PST is performed. It should be noted that, in such cases also, by making the distance between recovery ports 23 and the surface of substrate P (upper surface 52A of substrate stage PST) smaller, the liquid on the surface of substrate P or the upper surface of substrate stage PST can be recovered more reliably. By doing so, it can be prevented that a water mark will be formed on upper surface 52A of substrate stage PST.

It should be noted that, in each of the above-described embodiments, it may also be configured such that by providing separate recovery ports, other than recovery ports 23, the recovery operation using recovery ports 23 and the recovery operation using the separate recovery ports are performed in parallel after the liquid immersion exposure. Here, the separate recovery ports are ports that are not used during the liquid immersion exposure, and they are, for example, ports that are provided, relative to projection area AR1, on the more outer side of recovery ports 23, and/or ports that are provided on the upper surface of, or in the surrounding area of, substrate stage PST.

Figure 18:
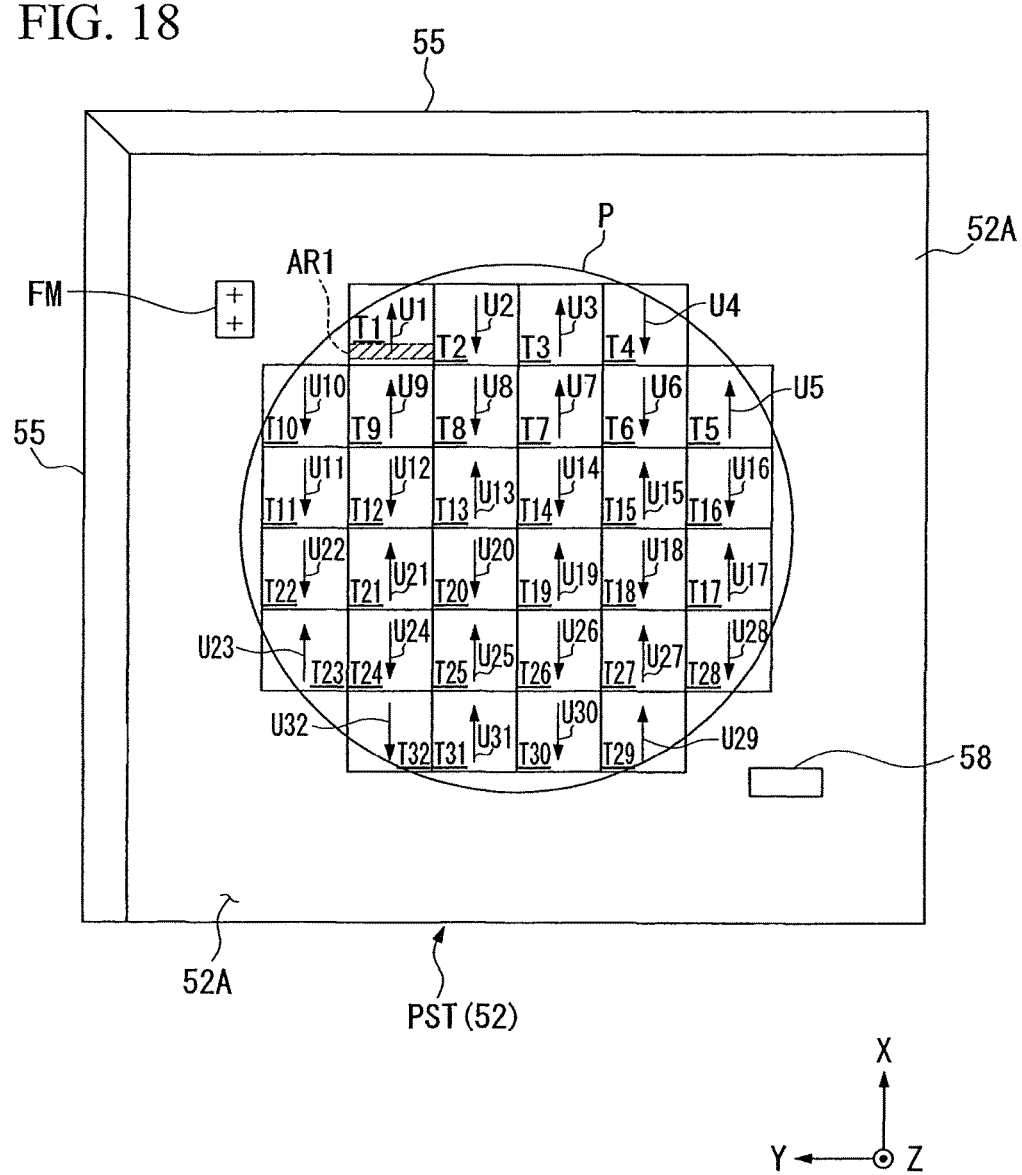
FIG. 18 is a drawing for explaining an example of an exposure sequence.

FIG. 18 shows an example of an exposure sequence performed by exposure apparatus EX of the above-described embodiment. Here, substrate stage PST is the same as that of FIG. 17. Further, the exposure sequence shown in FIG. 18 can be executed in an appropriate combination with the embodiments described earlier with reference to FIGS. 1 to 16.

As shown in FIG. 18, on substrate P are set a plurality of shot areas T1-T32 that are located with a predetermined pitch in the X-axis direction (scanning direction) and with a predetermined pitch in the Y-axis direction. Controller CONT starts exposure with the first shot area T1 and thereafter sequentially exposes the shot areas T2, T3, . . . , and T32. In this process, the scanning tracks of the slit-shaped projection area AR1 at the above shot areas are respectively shown by the arrows U1, U2, . . . , and U32. In other words, in the exposure sequence of this embodiment, the order of exposure of the shot areas is set such that when two consecutive shot areas are sequentially exposed, substrate P (mask M) does not move in the same direction; controller CONT, while moving substrate P alternately in the +X-direction (first direction) and in the −X-direction (second direction), sequentially exposes the plurality of shot areas T1-T32 on substrate P, which are to be exposed. Because the height of upper surface 52A of substrate stage PST is substantially equal to that of the surface of substrate P, the shot areas, including the shot areas located near the periphery of substrate P, can be exposed while moving substrate P alternately in the +X-direction and in the −X-direction in this way. Note that, in fact, because the exposure of each shot area is performed with substrate P being moved relative to projection area AR1, substrate P moves in the directions opposite to the directions indicated by the arrows shown in FIG. 18.

Further, it may also be configured such that in sequentially exposing each shot areas T1-T32 of substrate P, the scanning speed of substrate P when exposing certain selected shot areas is made lower than that when exposing the other shot areas, depending on the positions of the selected shot areas.

In the case shown in FIG. 18, because the shot areas T1, T4, T5, T10, T23, T28, T29, and T32, which are formed on the peripheral portion of substrate P, lack a portion thereof and because with respect to the shot areas T2, T3, T30, and T31, the distance between the edge of the shot areas and the edge of substrate P is small, the boundary between the edge of substrate P and upper surface 52A of substrate stage PST comes to be included in liquid immersion region AR2, during or before/after exposure. Thus, when exposing those shot areas, the scanning speed of substrate P is preferably set to be lower than the scanning speed of substrate P when exposing the shot areas located near the center of substrate P (e.g., T13 and T14).

By doing so, even if there is a slight height difference between the surface of substrate P and upper surface 52A of substrate stage PST, the pressure change of the liquid existing between projection optical system PL and substrate P can be made small, and, at the same time, the surfaces of the shot areas can be made to accurately coincide with the image plane of projection optical system P1 by the autofocus system and the autoleveling system.

Further, it may also be configured such that depending upon the area of upper surface 52A of substrate stage PST (including the surface of substrate P) and upon the area (size) of liquid immersion region AR2, the scanning speed of substrate P when exposing each shot area is adjusted. For example, when it is intended that the shot areas located near the edge of substrate P (e.g., T1-T4 and T29-T32) are exposed with a scanning speed similar to that applied to the shot areas located near the center of substrate P (e.g., T13 and T14), there arises the possibility that liquid immersion region AR2 runs off upper surface 52A of substrate stage PST when substrate P is at the acceleration start position (run-up start position) or runs off upper surface 52A of substrate stage PST during deceleration of substrate P or at the deceleration end position thereof. In such a case, it is preferable that the scanning speed of substrate P when the shot areas located near the edge of substrate P (e.g., T1-T4 and T29-T32) are exposed is decreased. By doing so, the acceleration distance (run-up distance) and/or deceleration distance of substrate P when exposing the shot areas located near the edge of substrate P (e.g., T1-T4 and T29-T32) can be made to be shorter, and thus, without liquid immersion region AR2 running off upper surface 52A of substrate stage PST, each shot area (in particular, the shot areas located near the edge of substrate P) can be exposed with high accuracy while liquid 1 being held well between projection optical system PL and upper surface 52A of substrate stage PST.

It is to be noted that when it is desired that the decrease of the scanning speed, when exposing some shot areas, due to the short acceleration distance and/or deceleration distance be avoided and/or when the error of position control of the surface of substrate P through the autofocus system and the autoleveling system due the height difference between the surface of substrate P and upper surface 52A of substrate stage PST be avoided, the movement direction of substrate P when the shot areas T1, T2, T3, T4, T5, T23, T28, T29, T30, T31, and T32, which are located near the edge of substrate P may be set such that projection area AR1 moves from inside substrate P toward outside substrate P. In this case also, it is preferable that an exposure sequence (exposure order) in which substrate P is moved alternately in the +X-direction and in the −X-direction as far as possible.

In the above-described embodiments, liquid 1 is constituted by purified water. Purified water has the advantage that it is easily available in bulk in, e.g., semiconductor manufacturing factories and also the advantage that it does not adversely affect photoresist on substrate P, optical elements (lenses), etc. Further, purified water does not adversely affect the environment and contains scarcely any impurities; thus, the effect that it cleans the surface of substrate P and the surface of the optical element provided at the end portion of projection optical system PL can be expected.

The refractive index n of purified water (water) relative to exposure light EL having a wavelength of about 193 nm is approximately 1.44, and thus when ArF excimer laser light (having 193 nm wavelength) is used as the light source of exposure light EL, the wavelength is effectively shortened, on substrate P, as if multiplied by 1/n, i.e., effectively becomes approximately 134 nm, and thus, a high resolution can be obtained. Further, since the depth of focus increases by approximately n times, i.e., approximately by 1.44 times, compared with that in the air, when securing of the depth of focus on par with the depth of focus realized when the projection optical system is used in the air suffices, the numerical aperture of the projection optical system PL can be further increased; which also improves the resolution.

When the liquid immersion method is used as described above, the numerical aperture NA of the projection optical system PL may become 1.0 to 1.3. When the numerical aperture NA of the projection optical system PL exceeds 1.0, random-polarized light conventionally used as the exposure light may, because of its polarization effect, adversely affect the imaging performance; thus, a polarized light illumination method is preferably used. In this case, it is preferable that by performing linearly polarized light illumination in which the longitudinal direction of the line pattern of the line-and-space pattern on the mask (reticle) is aligned with the polarization direction, the proportion of diffraction lights of S polarization components (diffraction lights of the polarization components having the polarization direction in line with the longitudinal direction of the line pattern) from the pattern of the mask (reticle) is made to be larger. When the space between projection optical system PL and the resist applied to the surface of substrate P is filled with the liquid, the transmittance at the resist surface of the diffraction lights from S polarization, which contribute to the improvement of the contrast, is higher compared with the case where the space between projection optical system PL and the resist applied to the surface of substrate P is filled with the gas (air), a high imaging performance can be obtained even in the case where the numerical aperture NA of the projection optical system is over 1.0. It is to be noted that when a phase shift mask is used as the mask (reticle), it works more effectively. Further, because depending on the condition of the liquid between projection optical system PL and substrate P, e.g., the temperature of the liquid, the movement of the liquid (speed and direction), and the pressure of the liquid, the polarization condition of the exposure light irradiated onto substrate P may change, it may also be configured such that by taking into account of the polarization condition of the exposure light irradiated onto substrate P (e.g., by measuring the polarization condition) in various kinds of conditions, the optimization of the polarized light illumination as to the polarization direction and the polarization degree (optimization based on the measurement results of the polarization condition) is performed.

In the embodiments, optical element 2 is attached to the end of projection optical system PL, and with the aid of lens, the optical characteristics of projection optical system PL (spherical aberration, coma aberration, etc.) can be adjusted. It should be noted that as the optical element to be attached to the end of projection optical system PL, an optical plate used for the adjustment of the optical characteristics of projection optical system PL may be utilized. Alternatively, a plane parallel plate that can transmit exposure light EL may be utilized.

It should be noted that if the pressure, caused by the flow of liquid 1, of the space between the optical element located at the end of projection optical system PL and substrate P is high, it may be configured such that the optical element is rigidly fixed so as not to move due to the pressure, instead of making the optical element replaceable.

It should be noted that while, in the embodiments, it is configured such that the space between projection optical system PL and the surface of substrate P is filled with liquid 1, it may also be configured, for example, such that the space is filled with liquid 1 in the condition that a cover glass constituted by a plane parallel plate is attached to the surface of substrate P.

Further, as disclosed in PCT International Publication No. WO 2004/019128, a projection optical system wherein both of the optical path space on the image surface side and the optical path space on the mask M side of optical element 2 are filled with a liquid can also be adopted as projection optical system PL.

It should be noted that while, in the embodiments, liquid 1 is water, liquid 1 may be a liquid other than water. For example, when the light source of exposure light EL is an $F_2$ laser, the $F_2$ laser light does not transmit through water, and thus, as liquid 1, a fluorofluid that can transmit the $F_2$ laser light, such as fluorochemical oil or perfluoropolyether (PFPE), may be used. Further, as liquid 1, a material (e.g., cedar oil) that can transmit exposure light EL, has a high refractive index as high as practicable, and does not affect projection optical system PL and the photoresist applied to the surface of substrate P can also be used.

Also in this case, the surface treatment is applied in accordance with the polarity of liquid 1.

It is to be noted that as for substrate P of each of the above-described embodiments, not only a semiconductor wafer for manufacturing a semiconductor device, but also a glass substrate for a display device, a ceramic wafer for a thin film magnetic head, a master mask or reticle (synthetic quartz or silicon wafer), etc. can be used.

As for exposure apparatus EX, in addition to a scan type exposure apparatus (scanning stepper) in which while synchronously moving mask M and substrate P, the pattern of mask M is scan-exposed, a step-and-repeat type projection exposure apparatus (stepper) in which the pattern of mask M is exposed at one time in the condition that mask M and substrate P are stationary, and substrate P is successively moved stepwise can be used. Also, the present invention can be applied to a step-and-stitch type exposure apparatus in which at least two patterns are transferred onto substrate P in a partially overlapping manner.

Further, the present invention can be applied to a twin stage type exposure apparatus which, as disclosed in, e.g., Japanese Unexamined Patent Publication, First Publication No. H10-163099, Japanese Unexamined Patent Publication, First Publication No. H10-214783, and Published Japanese Translation No. 2000-505958 of PCT International Application, is provided with two stages which can move in the XY-direction independently of each other while separately holding thereon substrates to be exposed, e.g., wafers. In this case, the embodiments having been described using FIGS. 1 to 18 can be applied to each of the two stages.

Still further, the present invention can be applied to an exposure apparatus which, as disclosed in, e.g., Japanese Unexamined Patent Publication, First Publication No. H11-135400, is provided with a substrate stage which while holding thereon a substrate to be processed, e.g., a wafer, can move in the XY directions and with a measurement stage on which the above-described light sensor portion and/or fiducial mark are set and which can move independently of the substrate stage. In this case also, the embodiments having been described using FIGS. 1 to 18 can be applied to the substrate stage, and, further, it may also be configured such that after completion of various kinds of measurements performed by forming liquid immersion region AR2 on the measurement stage, the liquid remaining on the upper surface of the measurement stage is recovered while relatively moving recovery ports 23 and the measurement stage.

As for the type of exposure apparatus EX, the present invention is not limited to an exposure apparatus, which exposes a semiconductor pattern onto substrate P, for manufacturing semiconductor devices, but can also be applied to a variety of exposure apparatuses, e.g., an exposure apparatus for manufacturing liquid crystal display devices or a displays, an exposure apparatus for manufacturing thin film magnetic heads, an exposure apparatus for manufacturing image pickup devices, and an exposure apparatus for manufacturing reticles or masks.

When using a linear motor (see U.S. Pat. No. 5,623,853 or U.S. Pat. No. 5,528,118) for substrate stage PST and/or mask stage MST, either air-floating type linear motor using an air bearing or a magnetic levitation type linear motor using a Lorentz force or reactance force may be used. Further, each of substrate stage PST and mask stage MST may be either of a type moving along a guide or of a guideless type having no guide.

As for the driving mechanism for each of substrate stage PST and mask stage MST, a planar motor in which by making a magnet unit in which magnets are two-dimensionally arranged and an armature unit in which coils are two-dimensionally arranged face each other, each of substrate stage PST and mask stage MST is driven by an electromagnetic force may be used. In this case, either one of the magnet unit and the armature unit is attached to stage PST and stage MST, and the other unit is attached to the moving surface side of stage PST or stage MST.

A reaction force generated by the movement of substrate stage PST may be, as described in Japanese Unexamined Patent Publication, First Publication No. H08-166475 (U.S. Pat. No. 5,528,118), mechanically released to the floor (earth) by use of a frame member so that the force does not transmit to projection optical system PL. A reaction force generated by the movement of mask stage MST may be, as described in Japanese Unexamined Patent Publication, First Publication No. H08-330224 (U.S. patent application Ser. No. 08/416,558), mechanically released to the floor (earth) by use of a frame member so that the force does not transmit to projection optical system PL.

Exposure apparatus EX according to the embodiments of the present application is built by assembling various subsystems, including each element listed in the claims of the present application, in such a manner that prescribed mechanical accuracy, electrical accuracy, and optical accuracy are maintained. In order to ensure the various accuracies, prior to and after the assembly, every optical system is adjusted to achieve its optical accuracy, every mechanical system is adjusted to achieve its mechanical accuracy, and every electrical system is adjusted to achieve its electrical accuracy.

The process of assembling each subsystem into the exposure apparatus includes mechanical interfaces, electrical circuit wiring connections, and air pressure plumbing connections between each subsystem. Needless to say, there is also a process where each subsystem is assembled prior to the assembling of the exposure apparatus from the various subsystems. On completion of the process of assembling the various subsystems in the exposure apparatus, overall adjustment is performed to make sure that every accuracy is maintained in the complete exposure apparatus. Additionally, it is desirable to manufacture the exposure apparatus in a clean room, in which the temperature, purity, etc. are controlled.

Figure 19:
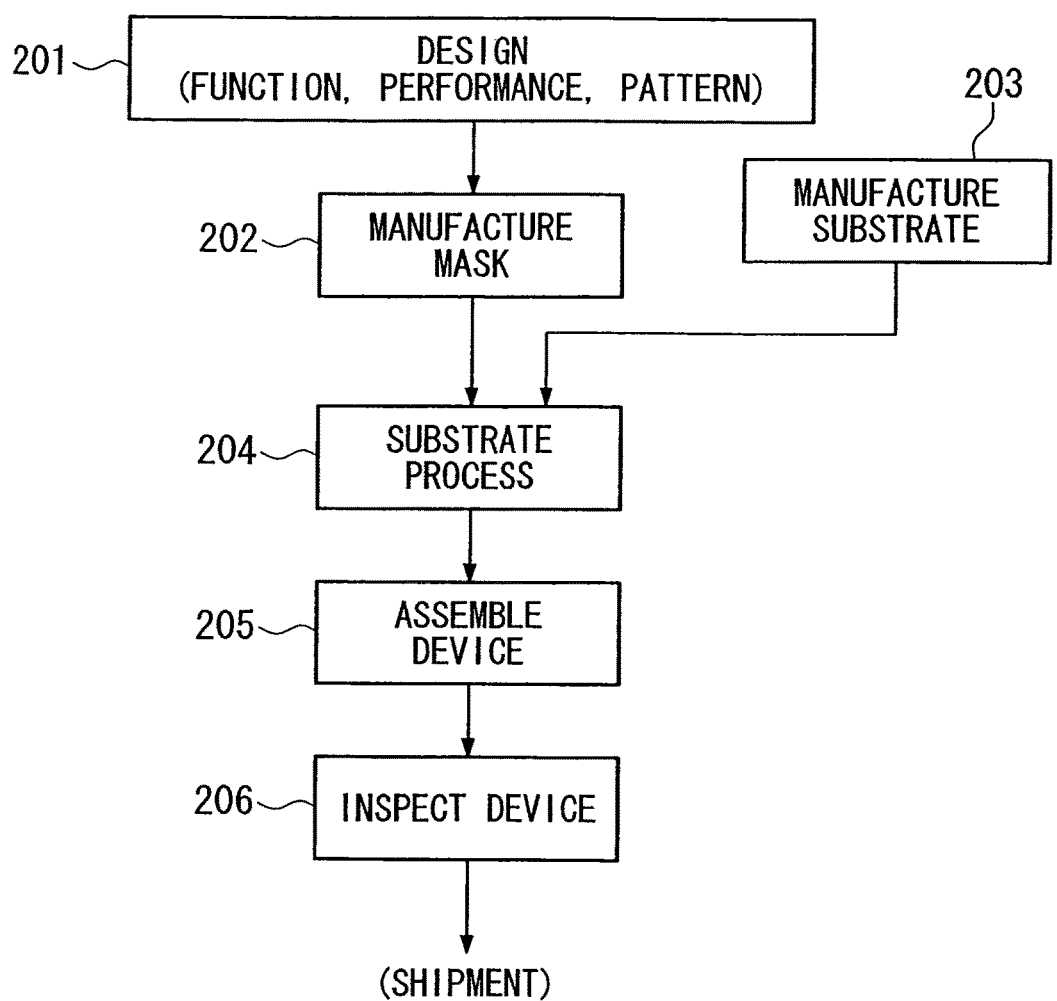
FIG. 19 is a flowchart showing an example of a semiconductor device manufacturing process.

As shown in FIG. 19, micro devices such as semiconductor devices are manufactured by a series of steps, including: step 201 in which the micro device's function and performance design is performed; step 202 in which a mask (reticle) is manufactured based on the design step; step 203 in which a substrate, the device's base material, is manufactured; substrate process step 204 in which the mask pattern is exposed onto the substrate by exposure apparatus EX according to the above-described embodiments; device assembly step 205 (including the dicing process, bonding process, and packaging process); inspection step 206.

Because the present invention provides an exposure apparatus that by irradiating an exposure light, via a projection optical system and a liquid, on a substrate placed on the image plane side of said projection optical system, exposes said substrate, wherein a liquid supply mechanism that supplies the liquid onto said substrate and a liquid recovery mechanism that recovers the liquid having been supplied on said substrate are provided and wherein when said exposure light is being irradiated on the image plane side of said projection optical system, said liquid recovery mechanism does not recover said liquid, the exposure process can be performed in a state that sound and vibration are reduced, and deterioration of pattern due to the remaining liquid can be prevented; and thus, devices having a desired performance can be manufactured while high exposure accuracy being maintained.

What is claimed is:

1. An exposure method in which a plurality of shot areas of a substrate are exposed, sequentially and respectively, the method comprising:
    holding the substrate on a substrate holder of a substrate stage such that a gap is formed along an edge of the substrate between the edge of the substrate and an upper surface of the substrate stage that surrounds the substrate holder, the substrate holder holding the substrate such that an upper surface of the substrate is substantially flush with the upper surface of the substrate stage;
    exposing one of the shot areas of the substrate to an image of a pattern through a liquid of a liquid immersion area, which covers only a portion of the upper surface of the substrate, while moving the substrate at a first scanning speed, the one of the shot areas being located near a center of the substrate; and
    exposing another one of the shot areas of the substrate to the image of the pattern through the liquid of the liquid immersion area, while moving the substrate at a second scanning speed that is lower than the first scanning speed, the another one of the shot areas being located near the edge of the substrate and a portion of the gap being included in the liquid immersion area during the exposing of the another one of the shot areas, wherein
    during the exposure of the plurality of shot areas of the substrate, the substrate stage is moved such that a portion of the liquid immersion area is formed on a part of the upper surface of the substrate stage, and
    during a first time period in which the one of the shot areas is exposed, a scanning speed of the substrate is maintained at the first scanning speed, and during a second time period in which the another one of the shot areas is exposed, the scanning speed of the substrate is maintained at the second scanning speed.

2. The method according to claim 1, wherein the second scanning speed is determined such that an adverse effect is prevented when the liquid immersion area is formed over the gap between the upper surface of the substrate and the upper surface of the substrate stage.

3. The method according to claim 2, wherein the adverse effect is due to a pressure of the liquid of the liquid immersion area.

4. The method according to claim 1, wherein the second scanning speed is determined such that the liquid of the liquid immersion area is prevented from running off the upper surface of the substrate stage.

5. The method according to claim 1, wherein the liquid immersion area is formed by supplying the liquid from a supply inlet and recovering the supplied liquid from a recovery outlet.

6. The method according to claim 5, wherein the recovery outlet recovers the liquid along with gas.

7. The method according to claim 6, wherein the recovery outlet faces downwardly toward the upper surface of the substrate.

8. The method according to claim 7, wherein the liquid supply inlet faces downwardly toward the upper surface of the substrate.

9. The method according to claim 1, wherein the gap is from 0.1 mm to 1 mm.

10. The method according to claim 1, wherein the another one of the shot areas is smaller than the one of the shot areas.

11. A device manufacturing method comprising:
    exposing a substrate using the exposure method of claim 1; and
    processing the exposed substrate.

12. The method according to claim 1, wherein the gap extends in a horizontal direction.

13. The method according to claim 1, wherein the gap extends horizontally between the edge of the substrate and an adjacent edge of the upper surface of the substrate stage.

14. The method according to claim 1, wherein at least a portion of the gap extends below the upper surface of the substrate stage.

15. The method according to claim 14, wherein the upper surface of the substrate stage is configured to maintain the liquid immersion area during exposure of a peripheral portion of the substrate with the image through the liquid of the liquid immersion area.

16. The method according to claim 14, wherein the upper surface of the substrate stage is configured to prevent the liquid of the liquid immersion area from flowing out during exposure of a peripheral portion of the substrate with the image through the liquid of the liquid immersion area.

17. The method according to claim 1, further comprising:
    forming the liquid immersion area of the liquid under an optical element of a projection optical system by supplying the liquid to, and recovering the liquid from, the liquid immersion area with a retaining member having (i) a lower surface that surrounds the optical element, (ii) an aperture in and surrounded by the lower surface and through which the image of the pattern is projected from the projection optical system, (iii) a liquid supply port through which the liquid is supplied, and (iv) liquid recovery ports located in the lower surface at least on opposite sides of the aperture, the retaining member forming the liquid immersion area by supplying the liquid through the liquid supply port and recovering the liquid through the liquid recovery ports.

18. An exposure method comprising:
    holding a substrate on a substrate holder of a substrate stage, the substrate holder holding the substrate such that an upper surface of the substrate is substantially flush with an upper surface of the substrate stage that surrounds the substrate holder;
    exposing one of shot areas of the substrate to an image of a pattern through a liquid of a liquid immersion area, which covers a portion of the upper surface of the substrate, while moving the substrate at a first speed,
    exposing another one of the shot areas of the substrate to the image of the pattern through the liquid of the liquid immersion area, which covers a portion of the upper surface of the substrate, while moving the substrate at a second speed that is lower than the first speed,
    wherein:
    a gap is formed along an edge of the substrate held on the substrate holder, the gap disposed between the edge of the substrate and the upper surface of the substrate stage,
    during the exposing of the another one of the shot areas, the liquid immersion area is formed over a portion of the gap,
    during the exposure of the shot areas of the substrate, the substrate stage is moved such that a portion of the liquid immersion area is formed on a part of the upper surface of the substrate stage, and during a first time period in which the one of the shot areas is exposed, a speed of the substrate is maintained at the first speed, and during a second time period in which the another one of the shot areas is exposed, the speed of the substrate is maintained at the second speed.

19. The method according to claim 18, wherein during the exposing of the one of the shot areas, the liquid immersion area is not formed over any portion of the gap.

20. The method according to claim 18, wherein during the exposing of the one of the shot areas, the liquid immersion area is formed only on the upper surface of the substrate.

21. The method according to claim 18, wherein during the exposing of the one of the shot areas, an entirety of the liquid immersion area is formed on the upper surface of the substrate.

22. The method according to claim 18, wherein the one of the shot areas is located in a central portion of the upper surface of the substrate.

23. The method according to claim 18, wherein the another one of the shot areas is located in a peripheral portion of the upper surface of the substrate.

24. The method according to claim 23, wherein the another one of the shot areas is smaller than the one of the shot areas.

25. The method according to claim 18, wherein pressure change of the liquid of the liquid immersion area is reduced by moving the substrate at the second speed that is lower than the first speed.

26. The method according to claim 18, wherein the liquid is retained under an optical element of a projection optical system, while the liquid immersion area is formed over the portion of the gap between the upper surface of the held substrate and the upper surface of the substrate stage.

27. The method according to claim 18, wherein a size of the gap is from 0.1 to 1.0 mm.

28. The method according to claim 18, wherein the shot areas are sequentially and respectively exposed while moving the substrate alternately in first and second directions that are opposite to each other.

29. The method according to claim 18, wherein the liquid immersion area is formed under an optical element of a projection optical system by performing a liquid supply from a supply port and a liquid recovery from a recovery port.

30. The method according to claim 29, wherein the recovery port is arranged such that the upper surface of the substrate faces the recovery port.

31. The method according to claim 30, wherein the supply port is arranged such that the upper surface of the substrate faces the supply port and such that the supply port surrounds a projection area to which the image of the pattern is projected.

32. The method according to claim 31, wherein the recovery port is arranged such that the recovery port surrounds the supply port.

33. The method according to claim 30, wherein the recovery port collects the liquid along with gas.

34. The method according to claim 18, wherein the substrate is moved at the second speed during the exposing of the another one of the shot areas such that the liquid of the liquid immersion area is prevented from flowing out.

35. The method according to claim 18, wherein the substrate is moved at the second speed during the exposing of the another one of the shot areas such that the liquid of the liquid immersion area is prevented from scattering.

36. The method according to claim 18, wherein the gap extends in a horizontal direction.

37. The method according to claim 18, wherein the gap extends horizontally between the edge of the substrate and an adjacent edge of the upper surface of the substrate stage.

38. The method according to claim 18, wherein at least a portion of the gap extends below the upper surface of the substrate stage.

39. The method according to claim 38, wherein the upper surface of the substrate stage is configured to maintain the liquid immersion area during exposure of a peripheral portion of the substrate with the image through the liquid of the liquid immersion area.

40. The method according to claim 38, wherein the upper surface of the substrate stage is configured to prevent the liquid of the liquid immersion area from flowing out during exposure of a peripheral portion of the substrate with the image through the liquid of the liquid immersion area.

41. The method according to claim 18, further comprising:

forming the liquid immersion area of the liquid under an optical element of a projection optical system by supplying the liquid to, and recovering the liquid from, the liquid immersion area with a retaining member having (i) a lower surface that surrounds the optical element, (ii) an aperture in and surrounded by the lower surface and through which the image of the pattern is projected from the projection optical system, (iii) a liquid supply port through which the liquid is supplied, and (iv) liquid recovery ports located in the lower surface at least on opposite sides of the aperture, the retaining member forming the liquid immersion area by supplying the liquid through the liquid supply port and recovering the liquid through the liquid recovery ports.

42. An exposure method comprising:

holding a substrate on a substrate holder of a substrate stage;

exposing one of shot areas of the substrate to an image of a pattern through a liquid of a liquid immersion area, which covers a portion of an upper surface of the substrate, while moving the substrate at a first speed; and exposing another one of the shot areas of the substrate to the image of the pattern through the liquid of the liquid immersion area, which covers a portion of the upper surface of the substrate, while moving the substrate at a second speed that is lower than the first speed, wherein:

the substrate stage has an upper surface that surrounds the substrate held by the substrate holder, the upper surface of the substrate stage is substantially flush with the upper surface of the substrate held by the substrate holder, during the exposing of the another one of the shot areas, the liquid immersion area extends over a portion of the upper surface of the held substrate and a portion of the liquid immersion area is formed on a part of the upper surface of the substrate stage, and during a first time period in which the one of the shot areas is exposed, a speed of the substrate is maintained at the first speed, and during a second time period in which the another one of the shot areas is exposed, the speed of the substrate is maintained at the second speed.

43. The method according to claim 42, wherein during the exposing of the one of the shot areas, the liquid immersion area is not formed on the upper surface of the substrate stage.

44. The method according to claim 42, wherein during the exposing of the one of the shot areas, the liquid immersion area is formed only on the upper surface of the substrate.

45. The method according to claim 42, wherein during the exposing of the one of the shot areas, an entirety of the liquid immersion area is formed on the upper surface of the substrate.

46. The method according to claim 42, wherein the one of the shot areas is located in a central portion of the upper surface of the substrate.

47. The method according to claim 42, wherein the another one of the shot areas is located in a peripheral portion of the upper surface of the substrate.

48. The method according to claim 47, wherein the another one of the shot areas is smaller than the one of the shot areas.

49. The method according to claim 42, wherein pressure change of the liquid of the liquid immersion area is reduced by moving the substrate at the second speed that is lower than the first speed.

50. The method according to claim 42, wherein a gap is formed between the upper surface of the substrate and the upper surface of the substrate stage.

51. The method according to claim 50, wherein a size of the gap is from 0.1 to 1.0 mm.

52. The method according to claim 50, wherein the liquid is retained under an optical element of a projection optical system, while the liquid immersion area covers the portion of the upper surface of the substrate and the portion of the upper surface of the substrate stage.

53. The method according to claim 50, wherein at least a portion of the gap extends below the upper surface of the substrate stage.

54. The method according to claim 53, wherein the upper surface of the substrate stage is configured to maintain the liquid immersion area during exposure of a peripheral portion of the substrate with the image through the liquid of the liquid immersion area.

55. The method according to claim 53, wherein the upper surface of the substrate stage is configured to prevent the liquid of the liquid immersion area from flowing out during exposure of a peripheral portion of the substrate with the image through the liquid of the liquid immersion area.

56. The method according to claim 42, wherein the shot areas are sequentially and respectively exposed while moving the substrate alternately in first and second directions that are opposite to each other.

57. The method according to claim 42, wherein the liquid immersion area is formed under an optical element of a projection optical system by performing a liquid supply from a supply port and a liquid recovery from a recovery port.

58. The method according to claim 57, wherein the recovery port is arranged such that the upper surface of the substrate faces the recovery port.

59. The method according to claim 58, wherein the supply port is arranged such that the upper surface of the substrate faces the supply port and such that the supply port surrounds a projection area to which the image of the pattern is projected.

60. The method according to claim 59, wherein the recovery port is arranged such that the recovery port surrounds the supply port.

61. The method according to claim 58, wherein the recovery port collects the liquid along with gas.

62. The method according to claim 42, wherein the substrate is moved at the second speed during the exposing of the another one of the shot areas such that the liquid of the liquid immersion area is prevented from flowing out.

63. The method according to claim 42, wherein the substrate is moved at the second speed during the exposing of the another one of the shot areas such that the liquid of the liquid immersion area is prevented from scattering.

64. The method according to claim 42, further comprising:
forming the liquid immersion area of the liquid under an optical element of a projection optical system by supplying the liquid to, and recovering the liquid from, the liquid immersion area with a retaining member having (i) a lower surface that surrounds the optical element, (ii) an aperture in and surrounded by the lower surface and through which the image of the pattern is projected from the projection optical system, (iii) a liquid supply port through which the liquid is supplied, and (iv) liquid recovery ports located in the lower surface at least on opposite sides of the aperture, the retaining member forming the liquid immersion area by supplying the liquid through the liquid supply port and recovering the liquid through the liquid recovery ports.

65. A method of manufacturing an exposure apparatus comprising:
providing a projection optical system having an optical element:
providing a substrate stage having a substrate holder on which a substrate is held, a gap being formed between an edge of the substrate held on the substrate holder and an upper surface of the substrate stage that surrounds the held substrate, the upper surface of the substrate stage being substantially flush with an upper surface of the substrate held by the substrate holder;
providing a retaining member having a flow path through which a liquid flows and having an opening through which an image of a pattern is projected from the projection optical system, the retaining member forming a liquid immersion area of the liquid under the optical element of the projection optical system; and
providing a controller that controls an exposure operation in which a plurality of shot areas of the substrate are exposed sequentially and respectively to the image of the pattern through the liquid of the liquid immersion area which covers a portion of the upper surface of the substrate, wherein (i) the controller moves the substrate stage at a first speed to expose one of the shot areas of the substrate to the image of the pattern through the liquid of the liquid immersion area, (ii) the controller moves the substrate stage at a second speed, that is lower than the first speed, to expose another one of the shot areas of the substrate to the image of the pattern through the liquid of the liquid immersion area, (iii) during the exposing of the another one of the shot areas, the liquid immersion area is formed over a portion of the gap and a portion of the liquid immersion area is formed on a part of the upper surface of the substrate stage, and (iv) during a first time period in which the one of the shot areas is exposed, the controller maintains a speed of the substrate stage at the first speed, and during a second time period in which the another one of the shot areas is exposed, the controller maintains the speed of the substrate stage at the second speed.

66. The method according to claim 65, wherein the gap extends in a horizontal direction.

67. The method according to claim 65, wherein the gap extends horizontally between the edge of the substrate and an adjacent edge of the upper surface of the substrate stage.

68. The method according to claim 65, wherein
the retaining member has (i) a lower surface that surrounds the optical element, (ii) an aperture in and surrounded by the lower surface and through which the image of the pattern is projected from the projection optical system, (iii) a liquid supply port through which the liquid is supplied, and (iv) liquid recovery ports located in the lower surface at least on opposite sides of the aperture, and the retaining member forms the liquid immersion area of the liquid under the optical element of the projection optical system by supplying the liquid through the liquid supply port and recovering the liquid through the liquid recovery ports.

69. A method of manufacturing an exposure apparatus comprising:

providing a projection optical system having an optical element:

providing a substrate stage having a substrate holder on which a substrate is held and having an upper surface that surrounds the substrate held by the substrate holder, the upper surface of the substrate stage being substantially flush with an upper surface of the substrate held by the substrate holder;

providing a retaining member having a flow path through which a liquid flows and having an opening through which an image of a pattern is projected from the projection optical system, the retaining member forming a liquid immersion area of the liquid under the optical element of the projection optical system; and providing a controller that controls an exposure operation in which a plurality of shot areas of the substrate are exposed sequentially and respectively to the image of the pattern through the liquid of the liquid immersion area which covers a portion of the upper surface of the substrate, wherein (i) the controller moves the substrate stage at a first speed to expose one of the shot areas of the substrate to the image of the pattern through the liquid of the liquid immersion area, (ii) the controller moves the substrate stage at a second speed, that is lower than the first speed, to expose another one of the shot areas of the substrate to the image of the pattern through the liquid of the liquid immersion area, (iii) during the exposing of the another one of the shot areas, the liquid immersion area covers a portion of the upper surface of the held substrate and a portion of the liquid immersion area is formed on the upper surface of the substrate stage, and (iv) during a first time period in which the one of the shot areas is exposed, the controller maintains a speed of the substrate stage at the first speed, and during a second time period in which the another one of the shot areas is exposed, the controller maintains the speed of the substrate stage at the second speed.

70. The method according to claim 69, wherein the retaining member has (i) a lower surface that surrounds the optical element, (ii) an aperture in and surrounded by the lower surface and through which the image of the pattern is projected from the projection optical system, (iii) a liquid supply port through which the liquid is supplied, and (iv) liquid recovery ports located in the lower surface at least on opposite sides of the aperture, and the retaining member forms the liquid immersion area of the liquid under the optical element of the projection optical system by supplying the liquid through the liquid supply port and recovering the liquid through the liquid recovery ports.

* * * * *